US010734265B2

(12) United States Patent
Janakiraman et al.

(10) Patent No.: US 10,734,265 B2
(45) Date of Patent: Aug. 4, 2020

(54) SEMICONDUCTOR PROCESS EQUIPMENT

(71) Applicant: Applied Materials, Inc., Santa Clara, CA (US)

(72) Inventors: Karthik Janakiraman, San Jose, CA (US); Hari K. Ponnekanti, San Jose, CA (US); Juan Carlos Rocha, San Carlos, CA (US); Mukund Srinivasan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 64 days.

(21) Appl. No.: 16/016,767

(22) Filed: Jun. 25, 2018

(65) Prior Publication Data

US 2018/0308735 A1 Oct. 25, 2018

Related U.S. Application Data

(62) Division of application No. 15/004,406, filed on Jan. 22, 2016, now Pat. No. 10,056,279.

(Continued)

(51) Int. Cl.
*H01L 21/677* (2006.01)

(52) U.S. Cl.
CPC .. *H01L 21/67709* (2013.01); *H01L 21/67742* (2013.01)

(58) Field of Classification Search
CPC ......... H01L 21/67709; H01L 21/67742; H01L 21/67766; H01L 21/67778

(Continued)

(56) References Cited

U.S. PATENT DOCUMENTS

| 5,180,048 A | 1/1993 | Kawada et al. |
| 5,641,054 A * | 6/1997 | Mori ............... H01L 21/67167 |
| | | 198/619 |

(Continued)

FOREIGN PATENT DOCUMENTS

| CN | 101158852 | 4/2008 |
| DE | 102018006259 A1 * | 12/2019 ............. H02N 15/00 |

(Continued)

OTHER PUBLICATIONS

International Search Report dated Apr. 25, 2016 for Application No. PCT/US2016/012600.

(Continued)

*Primary Examiner* — Saul Rodriguez
*Assistant Examiner* — Brendan P Tighe
(74) *Attorney, Agent, or Firm* — Patterson + Sheridan, LLP

(57) ABSTRACT

A system for processing a substrate is provided including a first planar motor, a substrate carrier, a first processing chamber, and a first lift. The first planar motor includes a first arrangement of coils disposed along a first horizontal direction, a top surface parallel to the first horizontal direction, a first side, a second side. The substrate carrier has a substrate supporting surface parallel to the first horizontal direction. The first processing chamber has an opening to receive a substrate disposed on the substrate carrier. The first lift includes a second planar motor having a second arrangement of coils disposed along the first horizontal direction. A top surface top surface of the second planar motor is parallel to the first horizontal direction. The first lift is configured to move the top surface of the second planar motor between a first vertical location and a second vertical location.

18 Claims, 16 Drawing Sheets

Related U.S. Application Data

(60) Provisional application No. 62/107,303, filed on Jan. 23, 2015.

(58) Field of Classification Search
USPC .................. 198/370.13, 619, 805; 414/749.2
See application file for complete search history.

(56) References Cited

U.S. PATENT DOCUMENTS

| | | |
|---|---|---|
| 6,206,176 B1 | 3/2001 | Blonigan et al. |
| 7,293,950 B2 | 11/2007 | Bonora et al. |
| 7,438,175 B2 | 10/2008 | White et al. |
| 7,841,820 B2 | 11/2010 | Bonora et al. |
| 7,948,122 B2 | 5/2011 | Compter et al. |
| 8,066,466 B2 | 11/2011 | Rice et al. |
| 8,851,817 B2 | 10/2014 | Bonora et al. |
| 2004/0023495 A1 | 2/2004 | Butterfield et al. |
| 2007/0269297 A1* | 11/2007 | Meulen ............. B65G 25/02 414/222.01 |
| 2008/0175694 A1 | 7/2008 | Park et al. |
| 2010/0226737 A1 | 9/2010 | Sakaue et al. |
| 2011/0312189 A1 | 12/2011 | Kim et al. |
| 2012/0109355 A1 | 5/2012 | Baccini et al. |
| 2012/0213614 A1 | 8/2012 | Bonora et al. |

FOREIGN PATENT DOCUMENTS

| | | | |
|---|---|---|---|
| JP | 62121134 | 6/1987 | |
| WO | WO-2019238416 A1 * | 12/2019 | ....... H01L 21/67724 |

OTHER PUBLICATIONS

Chinese Office Action dated Nov. 27, 2019 for Application No. 201610044160.5.

\* cited by examiner

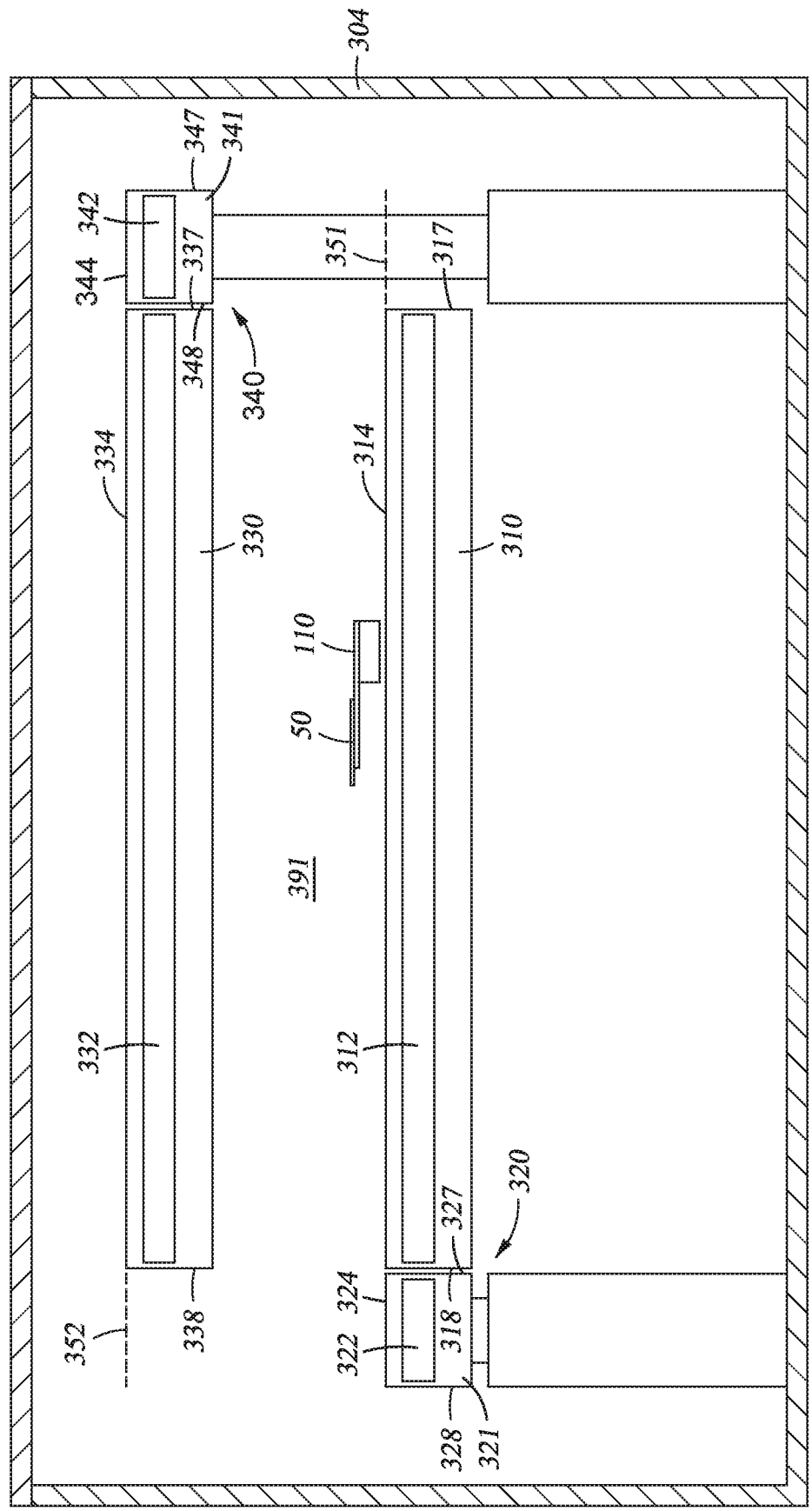

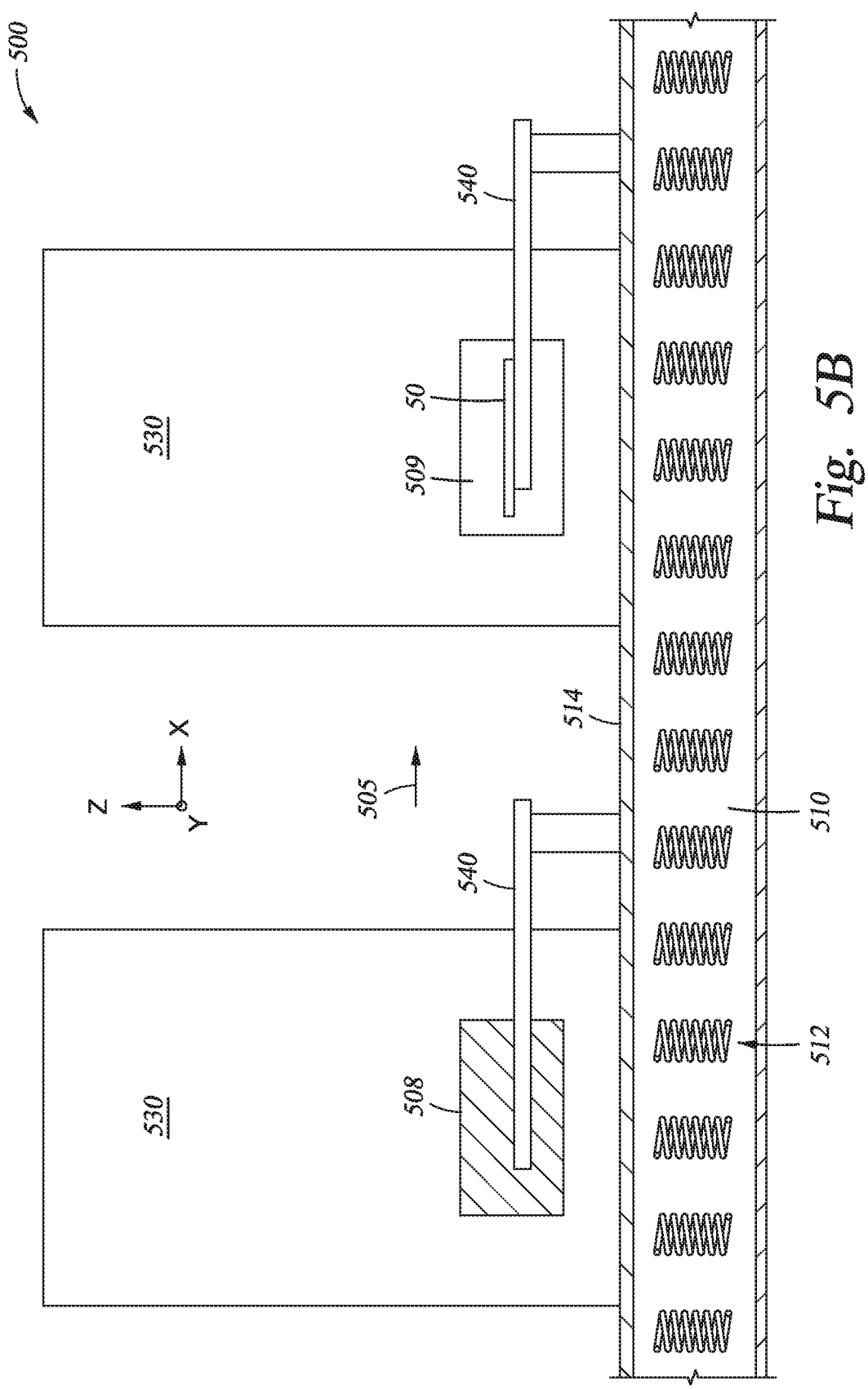

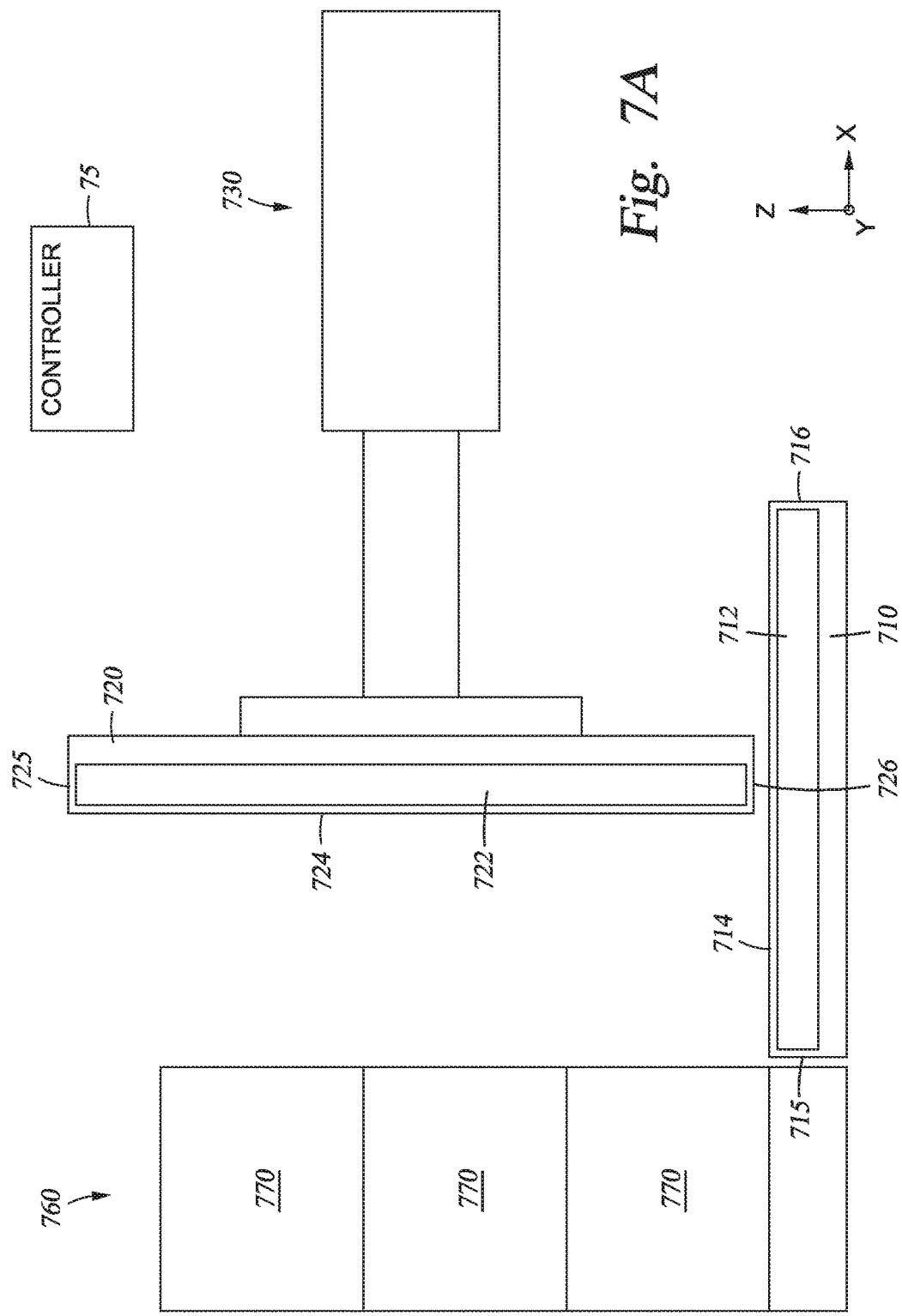

SEMICONDUCTOR PROCESS EQUIPMENT

CROSS-REFERENCE TO RELATED APPLICATIONS

This application is a divisional of U.S. patent application Ser. No. 15/004,406, filed Jan. 22, 2016, which claims benefit of U.S. provisional patent application Ser. No. 62/107,303, filed Jan. 23, 2015, which is hereby incorporated herein by reference.

BACKGROUND

Field

Embodiments disclosed herein generally relate to semiconductor process equipment used to transfer semiconductor substrates.

Description of the Related Art

Semiconductor devices are typically formed on semiconductor substrates using numerous process chambers, where each process chamber is used to complete one or more of the various steps (e.g., depositions) to form the semiconductor devices, such as a memory chip. Substrate transfer systems are typically used to move the substrates between each of the process chambers. The process chambers as well as the substrate transfer system can each be held at vacuum. Two common arrangements used for substrate transfer systems include a cluster arrangement and a linear arrangement.

A substrate transfer system using a cluster arrangement includes a central region surrounded by the different process chambers. The central region can be connected to a load lock chamber in order to maintain the vacuum environment within the substrate transfer system when the substrates are supplied and removed from the substrate transfer system. The central region, or transfer chamber, also typically includes a fixed robot that rotates about a central axis to move substrates to and from the load lock chamber as well as between the process chambers. These conventional robots are often limited to only transferring one or two substrates at a time and can cause the footprint of the central region to be large, due to the need for the robot to rotate and extend into the process chambers without the robot's arms interfering with the walls of the central region chamber in which the robot resides. These types of conventional robots can also be a source of particles, which is undesirable.

A substrate transfer system using a linear arrangement typically includes a conveyor having a rectangular top surface with process chambers on one side or opposing sides of the conveyor. The conveyor can be connected to a load lock chamber in order to maintain the vacuum environment within the substrate transfer system when the substrates are supplied and removed from the substrate transfer system. One or more robots that can be positioned near each of the process chambers to transfer the substrates between the conveyor and the process chambers. The conveyors used in these linear substrate transfer systems can be a source of particle generation, and require regular and involved maintenance activities to assure that the conveyor is performing correctly. Furthermore, the conveyor can only be moved in one direction at a time, which can limit the movement of the substrates on the conveyor reducing throughput.

Therefore, there is a need for improved substrate transfer systems that have reduced particle generation and footprint as well as increased throughput.

SUMMARY

Embodiments of the disclosure generally provide a system for processing a substrate. In one embodiment, the system includes a first planar motor, a substrate carrier, a first processing chamber, and a first lift. The first planar motor includes a first arrangement of coils disposed along a first horizontal direction, a top surface that is parallel to the first horizontal direction, a first side, a second side, a first end, and a second end. The substrate carrier has a substrate supporting surface that is parallel to the first horizontal direction, and the substrate carrier is disposed over the top surface. The first processing chamber has an opening disposed on the first side of the first planar motor, and the opening is configured to receive a substrate that is disposed on the substrate supporting surface of the substrate carrier. The first lift includes a second planar motor having a second arrangement of coils disposed along the first horizontal direction. A top surface top surface of the second planar motor is parallel to the first horizontal direction. The first lift further includes a first end and a second end. The first lift is configured to move the top surface of the second planar motor between a first vertical location and a second vertical location. The top surface of the first planar motor and the top surface of the second planar motor are substantially coplanar when the first lift is in the first vertical location.

In another embodiment, a system for processing substrates is provided including a first planar motor, a plurality of substrate carriers, and a plurality of process stations. The first planar motor includes a first arrangement of coils disposed along a first horizontal direction, and a top surface that is parallel to the first horizontal direction. The plurality of substrate carriers each have a substrate supporting surface that is parallel to the first horizontal direction. Each substrate carrier is configured to support a substrate and each substrate carrier is disposed over the top surface. The plurality of process stations are disposed around the first planar motor, and each process station includes a process chamber and a transfer support. The transfer support includes a portion configured to move a substrate between a first transfer position outside the process chamber and a second transfer position inside the process chamber.

In another embodiment, a system for processing substrates is provided including a first planar motor, a second planar motor, a substrate carrier, and a plurality of process chambers. The first planar motor includes a first arrangement of coils disposed across a first plane. The first planar motor includes a first surface, a first end, and a second end. The second planar motor includes a second arrangement of coils disposed across a second plane. The second planar motor includes a second surface, a first end, and a second end. The first plane is substantially perpendicular to the second plane. The substrate carrier includes a base, and a supporting surface. The substrate carrier further includes a first plurality of magnets disposed in a first magnet arrangement in the base. The first magnet arrangement is aligned substantially parallel to the supporting surface of the substrate carrier. The substrate carrier further includes a second plurality of magnets disposed in a second magnet arrangement in the base. The second magnet arrangement is aligned substantially perpendicular to the first magnet arrangement. The plurality of process chambers are disposed across a third plane, and the third plane is substantially perpendicular to the first plane.

In another embodiment, a method for moving a substrate in a substrate transfer system is provided. The method includes placing the substrate on a substrate supporting surface of a substrate carrier, levitating and moving the substrate carrier above a top surface of a first planar motor by adjusting magnetic fields generated by coils in the first planar motor, and levitating and moving the substrate supporting surface of the substrate carrier into a first process chamber by adjusting magnetic fields generated by coils in the first planar motor, where the substrate is placed in the first process chamber.

In another embodiment, a method for moving a substrate in a substrate transfer system is provided. The method includes: (a) levitating and moving a plurality of substrate carriers in a loop above a top surface of one or more planar motors by adjusting magnetic fields generated by coils in one or more planar motors, where the substrate is disposed on a substrate supporting surface of a first substrate carrier; (b) stopping the plurality of substrate carriers at a plurality of transfer locations on the loop for a delay period by holding the magnetic fields generated by each of the coils in the one or more planar motors substantially constant, each transfer location configured for transferring a substrate from a substrate carrier to a chamber, where each substrate carrier is stopped at a different transfer location, and at least two of the transfer locations are positioned at process stations, each process station including a process chamber and a transfer support; (c) when the first substrate carrier is stopped at a destination process station of the first substrate carrier, transferring the substrate from the first substrate carrier to the process chamber of the destination process station using the transfer support of the destination process station; and (d) repeating (a)-(c).

In another embodiment, a method for moving a substrate in a substrate transfer system is provided. The method includes placing the substrate on a substrate supporting surface of a substrate carrier, levitating and moving the substrate carrier above a first surface of a first planar motor having a first arrangement of coils disposed across a horizontal plane by adjusting magnetic fields generated by coils in the first planar motor, and moving the substrate on the substrate supporting surface of the substrate carrier from a first vertical location to a second vertical location by adjusting magnetic fields generated by coils in a second planar motor, the second planar motor having a second surface facing the substrate carrier, where the second planar motor has a second arrangement of coils disposed across a vertical plane and the substrate carrier moves from the first vertical location to the second vertical location along a path displaced from the second surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 3C is a side sectional view of a substrate transfer system, according to the embodiment shown in FIGS. 3A and 3B.

FIG. 5B is a partial side sectional view of a substrate transfer system, according to the embodiment of FIG. 5A.

FIG. 7A is a side view of a substrate transfer system, according to one embodiment.

To facilitate understanding, common words have been used, where possible, to designate identical elements that are common to the figures. It is contemplated that elements disclosed in one embodiment may be beneficially utilized on other embodiments without specific recitation.

DETAILED DESCRIPTION

The present disclosure relates generally to semiconductor process equipment used to transfer semiconductor substrates between process chambers. More specifically, embodiments disclosed herein are related to systems used to transfer semiconductor substrates between process chambers using a transport device that employs one or more magnetic levitation elements.

Using magnetic levitation to transport substrates between process chambers offers a number of advantages. First, magnetic levitation enables designs with reduced footprint, because the robots, which are typically used to transfer the substrates into and out of the process chambers, can be removed in some embodiments. Reducing the footprint of a substrate transfer system can reduce the capital costs of a substrate transfer system, as well as the operating and maintenance costs of the system and reduce the costs associated with the foot-print that the tool will take up in a semiconductor fab.

Second, fewer particles and less contamination will be generated when using a magnetic levitation device to transport substrates, as compared to mechanical systems that have moving parts and vacuum compatible greases, which can generate particles and outgas in a vacuum environment. For example, the movement of a central conveyor to transport substrates between process chambers can generate particles from the motion of the conveyor relative to its supporting components and from the contact between a substrate and the conveyor. The generated particles and contamination can negatively affect product quality and in some cases reduce production yield.

Figure 1:
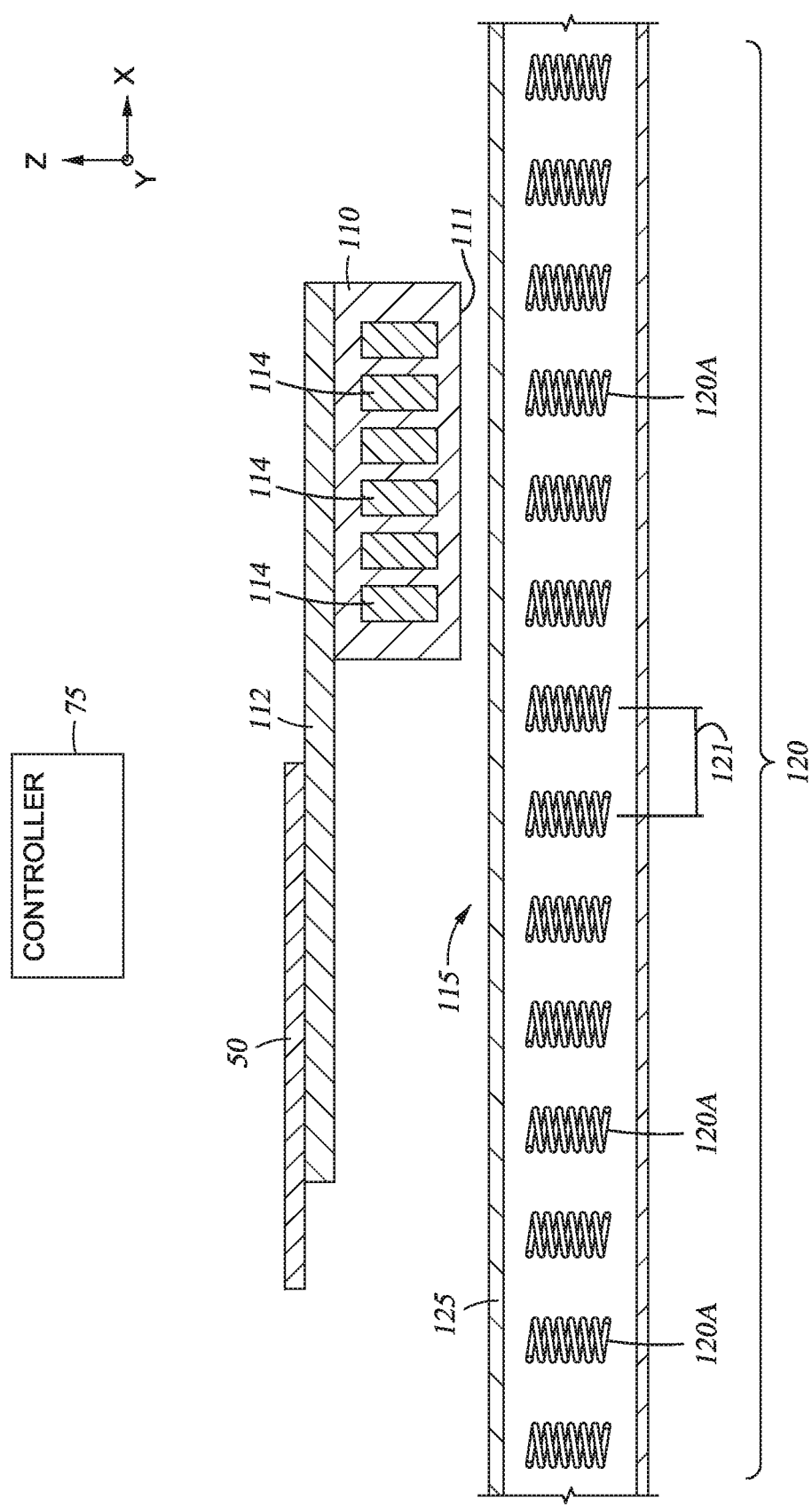
FIG. 1 is a partial side sectional view of a magnetically levitated substrate carrier, according to one embodiment.

On the other hand, using magnetic levitation devices minimizes the amount of contact between a substrate carrier and the remainder of a substrate transfer system. Referring to FIG. 1, a partial side sectional view of a substrate transfer system 100 using magnetic levitation is shown. The substrate transfer system 100 includes a substrate carrier 110 having a base 111 and a substrate supporting surface 112. The base 111 includes a plurality of magnets 114. In some configurations, the plurality of magnets 114 may be arranged such that they form a Halbach array or other similar configuration. A substrate 50 can be placed on the substrate supporting surface 112 of the substrate carrier 110. The substrate carrier 110 can transport the substrate 50 between the different process chambers (not shown) within the substrate transfer system 100 as well as to and from a load lock chamber (not shown) used to supply and remove substrates from the substrate transfer system 100. The substrate carrier 110 may be formed from a non-magnetic material, such as aluminum. In some configurations of the substrate transfer system 100 it is beneficial to select the material from which the substrate carrier 110 is made to include a material that can also withstand high processing temperatures. In one example, the substrate carrier 110 is made from a ceramic material (e.g., alumina, quartz, zirconia, etc.). In some cases, the substrate carrier 110 may be coated with an electrically conductive coating to resolve any charge build-up issues in the substrate carrier 110 during processing within the substrate transfer system 100, which are discussed below.

The substrate transfer system 100 further includes a planar motor 115 having an arrangement of coils 120 disposed below a plate 125, such as a non-magnetic material containing plate, for example, an aluminum plate. The plate 125 separates the arrangement of coils 120 from the interior of the substrate transfer system 100 while allowing magnetic fields produced by the arrangement of coils 120 to interact with and control the position of the substrate carrier 110 using the plurality of magnets 114. A controller 75 and power connections (not shown) to each coil in the arrangement of coils 120 can be used to adjust the magnetic fields generated by each coil. In some embodiments, each coil can be separated from the other coils in the arrangement of coils 120 by a first distance 121 to provide consistent control of the movement and orientation of a levitated substrate carrier 110 relative to the planar motor 115. The plurality of magnets 114 in the base 111 of the substrate carrier 110 can be an array or matrix of permanent magnets positioned in a complementary arrangement to the arrangement of coils 120. The array or matrix of permanent magnets and the arrangement of coils 120 can be arrayed in a complementary orientation in the X-Y plane. In one example, the individual coils 120A within the arrangement of coils 120 are wound such that the magnetic field(s) generated when power is supplied to them interact with the generated magnetic fields created by a permanent magnet found within each of the magnets 114. The specific pattern of the magnets 114 in the substrate carrier 110 can be used to control the movement and orientation of the substrate carrier 110 relative to the fixed arrangement of coils 120. The individual coils 120A may be designed to have cross-section in the Z-direction of FIG. 1 that is circular, square, rectangular, elliptical, or other shapes.

Furthermore, in some embodiments a plurality of sensors may be disposed in the planar motor 115 or other suitable location to detect the position of the substrate carriers 110 in the substrate transfer system 100. For example, in one embodiment a plurality of Hall Effect sensors or magnetic encoders may be positioned at various locations in the planar motor 115 to detect a 3-dimensional position of the substrate carriers 110. The sensors may be connected to the controller 75 to provide feedback on the position of the substrate carriers 110 to the controller 75. The controller 75 can use the signals from the sensors in feedback control loops to make adjustments when needed to the power levels provided to the different individual coils 120A, so that the positions of the substrate carriers 110 can be changed or maintained.

Many of the following embodiments described in this disclosure use features similar to or the same as those shown in FIG. 1, such as the arrangement of coils 120 to position the substrate carrier 110. These features allow the substrate carriers to move throughout the substrate transfer systems with little or no contact with the other parts of the substrate transfer systems, which minimizes particle generation.

Figure 2:
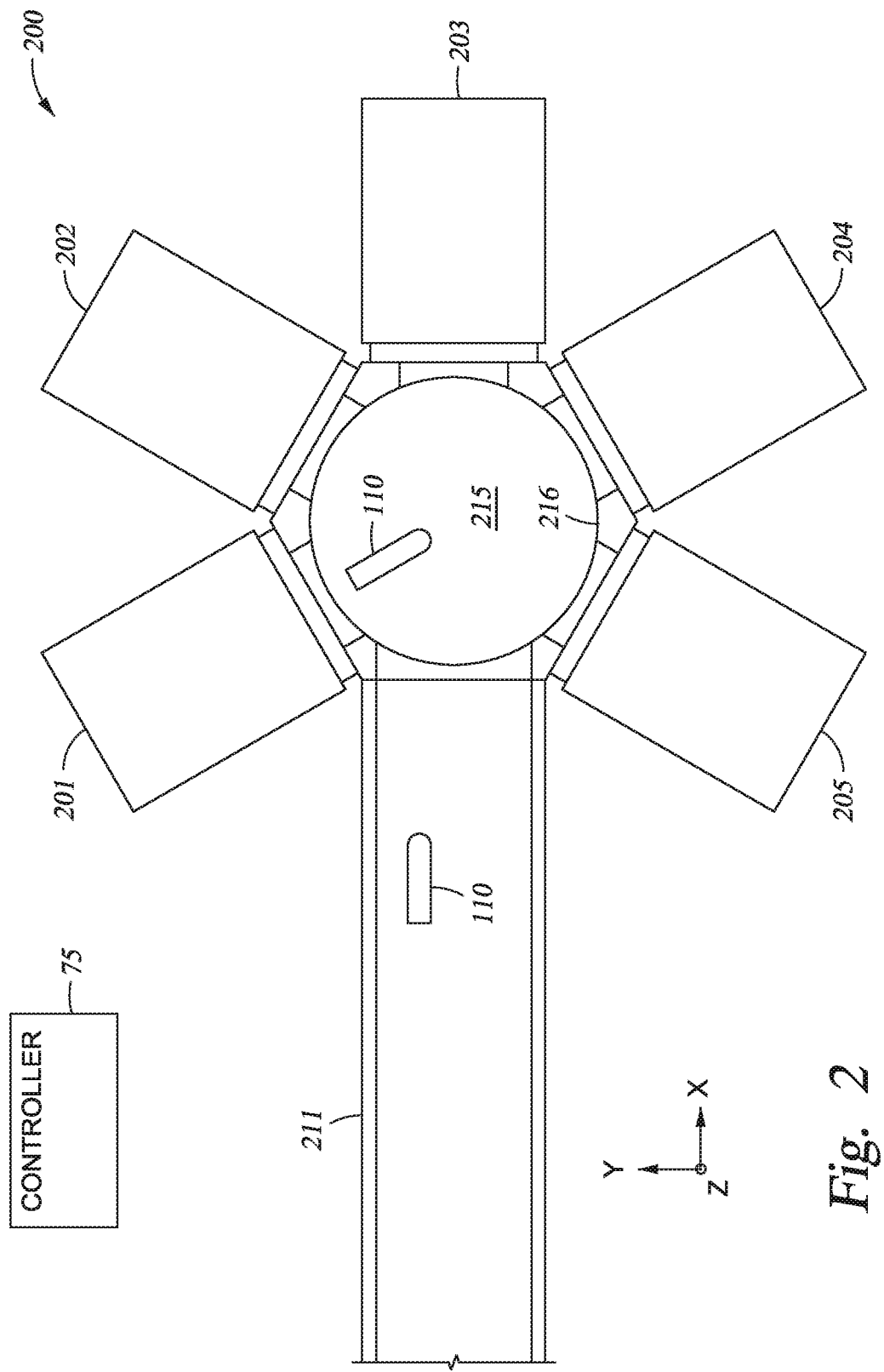
FIG. 2 is a top view of a substrate transfer system using a cluster arrangement of process chambers, according to one embodiment.

Exemplary Substrate Transfer System for a Cluster Arrangement of Process Chambers FIG. 2 is a top view of a substrate transfer system 200 for a cluster arrangement of process chambers 201-205, according to one embodiment of the disclosure. The substrate transfer system 200 includes a central planar motor 215 that is surrounded by the process chambers 201-205. The substrate transfer system 200 may further include a housing 211 to contain a vacuum in the interior of the substrate transfer system 200 during operation. The substrate transfer system 200 also includes the controller 75 described above.

The planar motor 215 can include an arrangement of coils similar to the arrangement of coils 120 used in the substrate transfer system 100. Furthermore, multiple substrate carriers 110 used in the substrate transfer system 100 can be used in the substrate transfer system 200 to transport substrates 50 to the different process chambers 201-205. Thus, magnetic fields generated by the coils (not shown) in the planar motor 215, which are arrayed in the X-Y plane, can be used to move and control the position and orientation of the substrate carriers 110 in the substrate transfer system 200.

The coils in the planar motor 215 can be used to simultaneously move each of the substrate carriers 110 within the X-Y plane. For example, in one method, the controller 75 can be used to adjust the magnetic fields generated by the coils in the planar motor 215, so that each of the substrate carriers 110 can move along an outer edge 216 of the planar motor 215 and then stop at one of the process chambers 201-205 to transfer a substrate to or from that process chamber.

In another method, each of the substrate carriers 110 can be controlled independently in a random motion manner. For example, one substrate carrier 110 may transfer a substrate 50 from the process chamber 202 to the process chamber 205 taking a path across the center of the planar motor 215. Simultaneously, another substrate carrier 110 may transfer another substrate 50 from the process chamber 204 to the process chamber 203 taking a path along the outer edge 216 of the planar motor 215 while another substrate carrier 110 may remain levitated at a fixed position in front of the process chamber 201. To accomplish the random motion control of the different substrate carriers 110, a minimum distance may be maintained between the different substrate carriers 110, so that the coils controlling the position of one substrate carrier 110 do not interfere with the control of another substrate carrier 110. For example, the controller 75 may maintain a minimum number of coils between each of the substrate carriers 110, such as at least one coil or two coils, or even at least three, four or five coils, between each substrate carrier 110 at the closest points between the substrate carriers 110.

Exemplary Substrate Transfer System Using Vertical Lifts

Figure 3A:
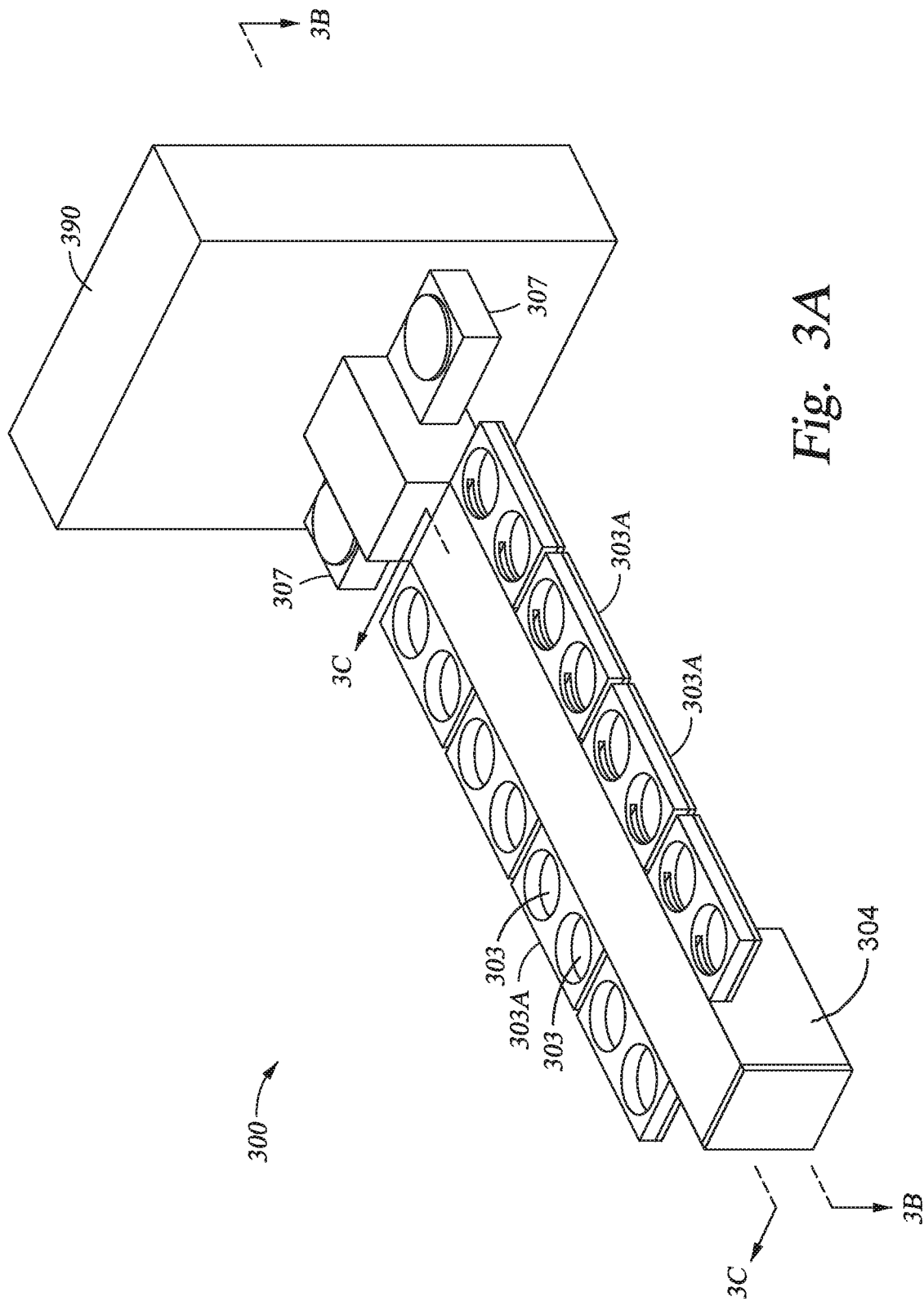
FIG. 3A is an isometric view of a substrate transfer system using a linear arrangement of process chambers, according to one embodiment.
Figure 3B:
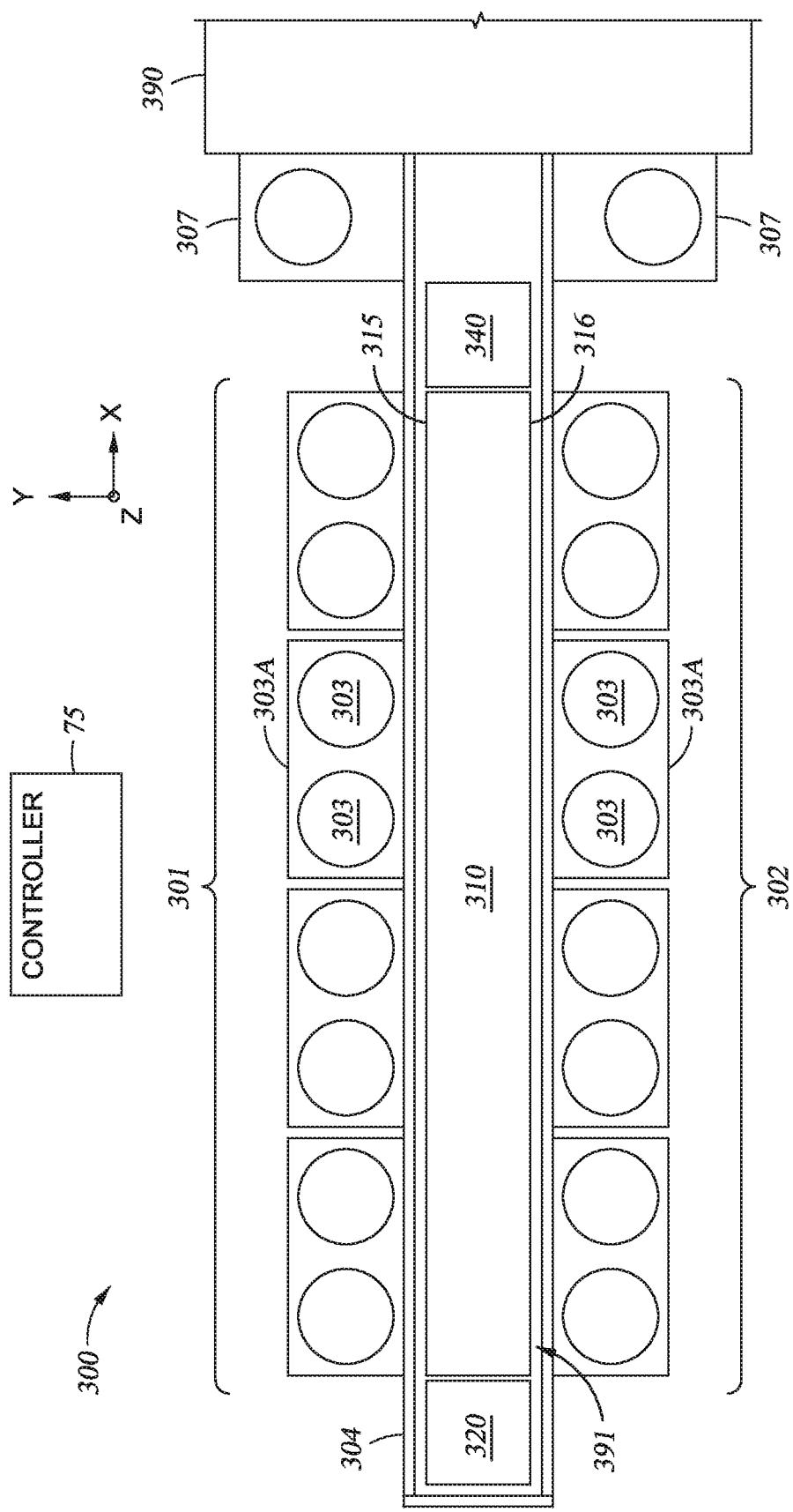
FIG. 3B is a sectional top view of a substrate transfer system, according to the embodiment of FIG. 3A.
Figure 3D:
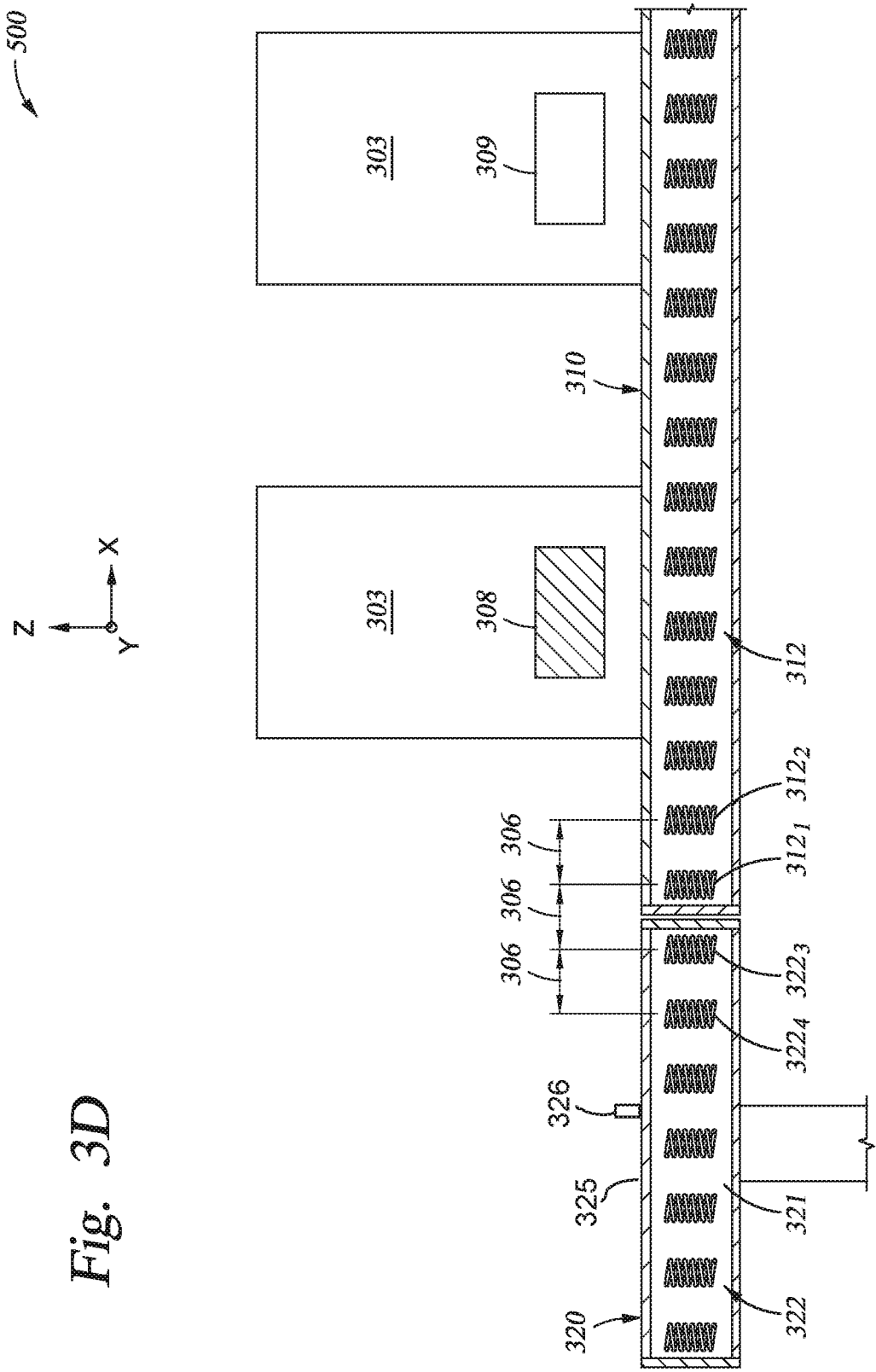
FIG. 3D is a partial side sectional view of a first planar motor and a second planar motor used in the embodiment shown in FIGS. 3A to 3C.
Figure 4:
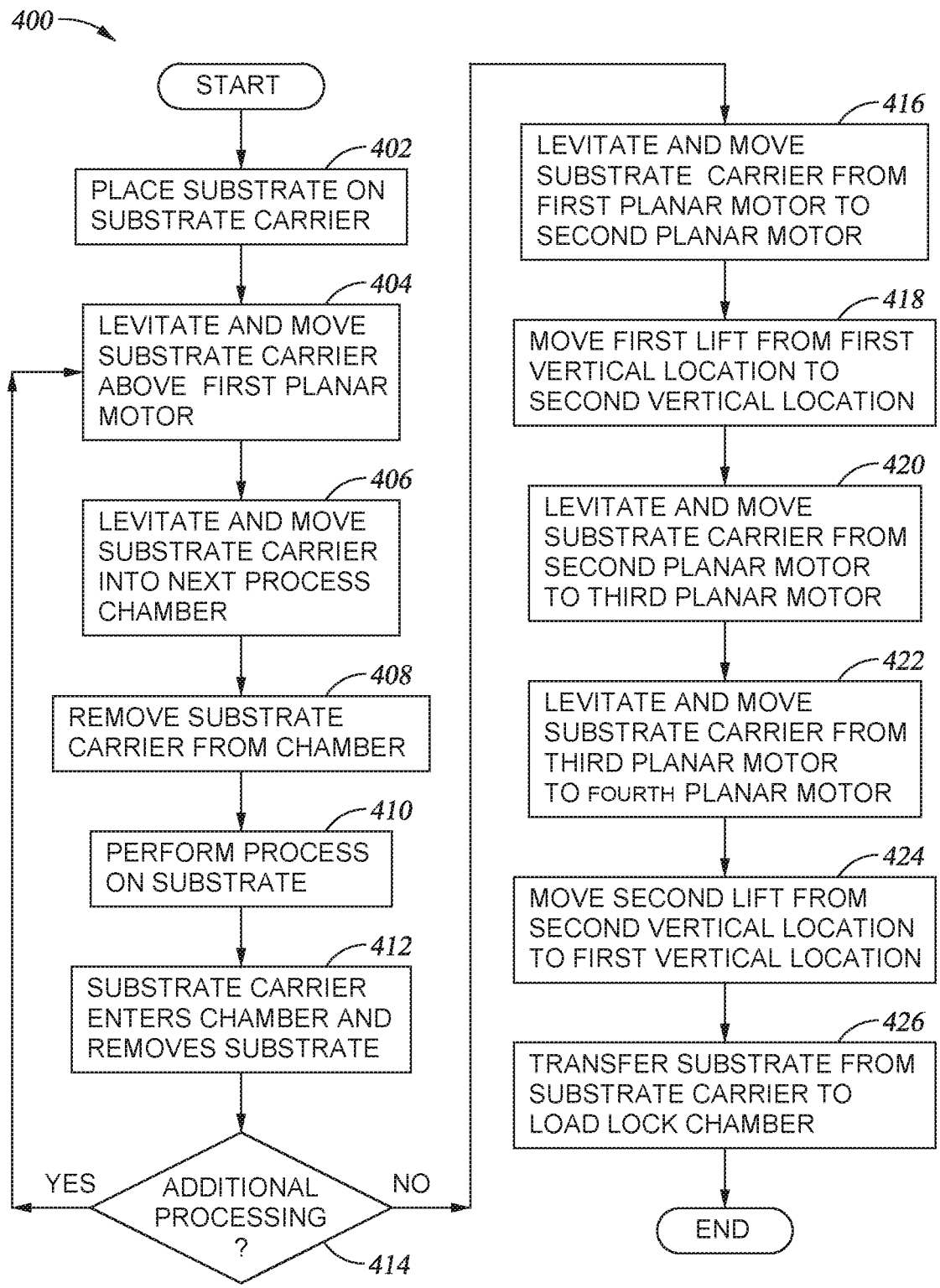
FIG. 4 is a process flow diagram for moving a substrate through the substrate transfer system illustrated in FIGS. 3A to 3C.

FIG. 3A is an isometric view of a substrate transfer system 300, according to one embodiment. FIG. 3B is a sectional top view of the substrate transfer system 300 taken along line 3B of FIG. 3A. FIG. 3C is a side sectional view of the substrate transfer system 300 taken along line 3C of FIG. 3A. The substrate transfer system 300 includes a first planar motor 310, a first lift 320 having a second planar motor 321, a third planar motor 330, a second lift 340 having a fourth planar motor 341, a plurality of process chambers 303, and the controller 75 described above. FIG. 3B is a top view from below the third planar motor 330 when the first lift 320 and the second lift 340 are in the lower position (i.e., lowest position in Z-direction). Furthermore, FIG. 3C is shown without the process chambers 303, so as to not make the drawing overly confusing. A side view of some of the process chambers 303 is shown in FIG. 3D.

Referring to FIGS. 3A to 3C, the substrate transfer system 300 includes a housing 304 to contain a vacuum in the interior 391 of the substrate transfer system 300. The substrate transfer system 300 further includes the first planar motor 310 having a first side 315, a second side 316, a first end 317, and a second end 318. The first planar motor 310 includes a first arrangement of coils 312 disposed in an array in the X-Y plane. A top surface 314 of the first planar motor 310 is parallel to the X-Y plane.

The substrate transfer system 300 further includes the substrate carrier 110 described above. Although only one substrate carrier 110 is shown in FIGS. 3A and 3B, numerous substrate carriers 110 can be used simultaneously in the substrate transfer system 300. Each substrate carrier 110 is configured to support a substrate 50. The substrate supporting surface 112 of the substrate carrier 110 is parallel to the X-Y plane. The individual coils (not shown) in the first arrangement of coils 312 can be energized by the controller 75 and power connections (not shown) to generate a magnetic field to move and levitate the substrate carrier 110 above the top surface 314. The substrate carrier 110 is disposed over the top surface 314 when the substrate carrier 110 is magnetically levitated. The plurality of magnets 114 are positioned in a complementary arrangement to the first arrangement of coils 312. Used herein, a complementary arrangement means that the coils in an arrangement of coils in a planar motor can be selectively energized and de-energized with varying levels of power to levitate and transport a substrate carrier above the top surface of the planar motor.

In some embodiments, the substrate transfer system 300 further includes a first arrangement of process chambers 301 disposed on the first side 315 of the first planar motor 310. A second arrangement of process chambers 302 can be disposed on the second side 316 of the first planar motor 310. The first and second arrangements of process chambers 301, 302 each include a plurality of process chambers 303. Each process chamber 303 can include an opening 309 (see FIG. 3D) that is configured to receive a substrate 50 disposed on the substrate supporting surface 112 of the substrate carrier 110. The opening 309 is covered by a door 308 during processing. Although the process chambers 303 shown in FIG. 3B are shown as being the same, each process chamber can be different from the other process chambers. In some embodiments, the substrate transfer system 300 may contain a plurality of process chamber pairs 303A, which each include two process chambers 303. In one example, the process chamber pairs 303A are each a Producer® chamber that is available from Applied Materials Inc. of Santa Clara, Calif. One or more load lock chambers 307 may also be included in the substrate transfer system 300 allowing transfer of substrates 50 to and from the interior 391 of the substrate transfer system 300. The load lock chambers 307 may additionally be connected to a factory interface 390.

In some processing sequences, an adjacent process chamber 303 within a process chamber pair 303A is also loaded with a substrate 50 using a different substrate carrier 110, so that both substrates 50 can be simultaneously processed. In one example, the processes performed in the process chamber pair 303A may include a plasma enhanced chemical vapor deposition (PECVD) process (e.g., PECVD dielectric deposition process), an etch process or other useful semiconductor device formation process. One will note that processes that generate a plasma, use an electrostatic chuck, and/or bias the substrate during processing can generate and trap an amount of charge in the substrate 50, which can then be transferred to the substrate carrier 110 during the substrate transferring steps of the process sequence 400. Moreover, it is believed that the inductive fields created within the substrate carrier 110 by the coils 120, may also generate fixed charges on opposing surfaces of a substrate carrier 110 that is formed from a dielectric material (i.e., positive charges on one face of the substrate carrier and negative charges on the opposing face). Since the substrate carrier 110 generally will not contact any surfaces or components with the substrate transfer system 100 due to the use of the magnetic levitation elements, and thus the trapped charges have no path to ground, the trapped charge in the substrate carrier 110 will remain indefinitely or until the generated charge becomes large enough to create an arc to ground or the trapped charge becomes accidently discharged, for example, by the substrate carrier 110 undesirably running into a wall. Since the trapped charge in the substrate carrier 110 can undesirably attract charged particles found within the substrate transfer system 100 to the substrate carrier 110, which can then be transferred to the substrate 50, it is beneficial to discharge this trapped charge before or during the substrate transferring steps performed during the process sequence 400. In some embodiments, grounding strips, flexible conductive wire elements or other conductive grounded elements may be electrically coupled to a grounded surface in the system or to a portion of the substrate carrier 110 so that an opposing end of the grounding strip, flexible wire element or other grounded element can form a path to ground at various points or places within the substrate transfer system 100. In one example, a grounded region 325 having a grounded flexure 326 (see FIG. 3D) may be included on the lift 320 may be positioned to contact a surface of the substrate carrier 110 as the substrate carrier enters or exits the lift 320. The grounded flexure 326 may also be included at other locations in the substrate transfer system 300, such as on the second lift 340 or on the first planar motor 310. Furthermore, the substrate transfer system 300 may include multiple grounded flexures 326 or other grounding devices to remove charges from the substrate carriers 110. Additionally, the other substrate transfer systems described in this disclosure may also include grounding devices, such as grounded flexure 326, to remove charges on the substrate carriers used in those substrate transfer systems.

The substrate transfer system 300 further includes the first lift 320 having the second planar motor 321 positioned at the top of the first lift 320. The second planar motor 321 has a first end 327 and a second end 328. The second planar motor 321 includes a second arrangement of coils 322 disposed along the X-Y plane. A top surface 324 of the second planar motor 321 is parallel to the X-Y plane. The first lift 320 is configured to move the top surface 324 of the second planar motor 321 between a first vertical location 351 (FIG. 3C) and a second vertical location 352 (FIG. 3C). The top surface 314 of the first planar motor 310 and the top surface 324 of the second planar motor 321 are substantially coplanar when the first lift 320 is in the first vertical location 351.

The substrate transfer system 300 further includes the third planar motor 330 with a first end 337 and a second end 338. The third planar motor 330 includes a third arrangement of coils 332 disposed along the X-Y plane. A top surface 334 of the third planar motor 330 is parallel to the X-Y plane. The top surface 314 of the first planar motor 310 is located at the first vertical location 351 and the top surface 334 of the third planar motor 330 is located at the second vertical location 352. Here, first planar motor 310 is shown below the third planar motor 330, but in some embodiments the third planar motor 330 can be disposed below the first planar motor 310 allowing the substrate carriers 110 to return towards the load lock chambers 307 (+X-direction) below the first planar motor 310. The top surface 334 of the third planar motor 330 and the top surface 324 of the second planar motor 321 are substantially coplanar when the top surface 324 of the second planar motor 321 is in the second vertical location 352.

The substrate transfer system 300 further includes the second lift 340 having the fourth planar motor 341. The fourth planar motor 341 has a first end 347 and an opposing second end 348. The fourth planar motor 341 includes a fourth arrangement of coils 342 disposed along the X-Y plane. A top surface 344 of the fourth planar motor 341 is parallel to the X-Y plane. The second lift 340 is configured to move the top surface 344 of the second lift 340 between the first vertical location 351 and the second vertical location 352. The top surface 314 of the first planar motor 310 and the top surface 344 of the fourth planar motor 341 are substantially coplanar when the top surface 344 of the fourth planar motor 341 is in the first vertical location 351. The top surface 334 of the third planar motor 330 and the top surface 344 of the fourth planar motor 341 are substantially coplanar when the top surface 344 of the fourth planar motor 341 is in the second vertical location 352.

The plurality of magnets 114 (FIG. 1) in the substrate carrier 110 are also positioned in a complementary arrangement to the second, third and fourth arrangement of coils 322, 332, and 342. The individual coils within the arrangement of coils 322, 332, and 342 are wound such that the magnetic field generated when power is supplied to them interact with the magnetic fields generated by the magnets 114, as similarly discussed above.

FIG. 3D is a partial side sectional view of the first planar motor 310 and the second planar motor 321 used in the configurations illustrated in FIGS. 3A and 3B. The first arrangement of coils 312 includes a first coil $312_1$ and a second coil $312_2$ and the second arrangement of coils 322 includes a third coil $322_3$, wherein the second coil $312_2$ and the third coil $322_3$ are each a first distance 306 from the first coil $312_1$ when the first lift 320 is in the first vertical location 351. The first distance 306 can be from about 0.1 inches to about 1.2 inches, such as from about 0.25 inches to about 0.6 inches. Making the second coil $312_2$ and the third coil $322_3$ each be a same distance from the first coil $312_1$ allows the substrate carrier 110 to make a smooth transition from above the first planar motor 310 to above the second planar motor 321. A fourth coil $322_4$ is also a first distance from the third coil $322_3$. Although not shown, the coils in the other planar motors 330, 341 can be similarly arranged to ensure smooth transitions when the substrate carrier 110 moves from the second planar motor 321 to the third planar motor 330, from the third planar motor 330 to the fourth planar motor 341, and from the fourth planar motor 341 to the first planar motor 310.

Referring to FIGS. 3A to 3C, and FIG. 4, a process sequence 400 is described for moving a substrate 50 through the substrate transfer system 300. Although the method is described in conjunction with reference to the systems of FIGS. 3A to 3C, persons skilled in the art would understand that any substrate transfer system configured to perform the method steps, in any order, is within the scope of the embodiments disclosed herein. The process sequence 400 can be executed by the controller 75, which can control equipment, such as the power supplied to the coils in the planar motors 310, 321, 330, 341, the lifts 320, 340, the doors 308 on the process chambers 303, etc. In some embodiments, the transfer processes performed within the process sequence 400, which are performed within the interior 391, are performed in a sub-atmospheric pressure (e.g., vacuum) environment, or inert containing atmospheric pressure environment.

At block 402, the substrate 50 is placed on the substrate supporting surface 112 of the substrate carrier 110. The substrate 50 can be placed on the substrate carrier 110 when the substrate carrier 110 is positioned over the fourth planar motor 341 of the second lift 340, when, for example, the second lift is positioned in the second vertical location 352. In one embodiment, a robot (not shown) in one of the load lock chambers 307 transfers the substrate 50 from one of the load lock chambers 307 to the substrate supporting surface 112 of the substrate carrier 110. If the substrate carrier 110 is above the fourth planar motor 341, then the substrate carrier 110 is levitated and moved so that the substrate carrier 110 is above the top surface 314 of the first planar motor 310 by adjusting magnetic fields generated by coils in the fourth planar motor 341 and the first planar motor 310. Used herein, levitating and moving refers to placing or maintaining a substrate carrier in a levitated state, and then moving the substrate carrier in a levitated state.

At block 404, the substrate carrier 110 is levitated and moved so that the substrate carrier 110 is positioned above the top surface 314 of the first planar motor 310 by adjusting magnetic fields generated by coils in the first planar motor 310.

At block 406, the substrate carrier 110 and substrate 50 on the substrate carrier 110 are levitated and moved to a destination process chamber (a first process chamber) to place the substrate 50 in the destination process chamber. The door 308 of the destination process chamber is opened before the substrate enters the destination process chamber. The door 308 of the process chamber is configured to allow transfer of the substrate 50 when opened. The substrate supporting surface 112 of the substrate carrier 110 is moved into the destination process chamber by adjusting magnetic fields generated by coils in the first planar motor 310. In one embodiment, the substrate 50 the substrate 50 is removed from the substrate carrier 110 by use of lift pins (not shown) that are moveable within the destination process chamber.

At block 408, the substrate carrier 110 is removed from the destination process chamber and the door 308 to the destination process chamber is closed.

At block 410, a process, such as a deposition process, is performed on the substrate 50 within the destination process chamber 303.

At block 412, the substrate carrier 110 enters the destination process chamber and the substrate 50 is placed on the substrate supporting surface 112 of the substrate carrier 110, such as by using the lift pins described above. The same substrate carrier 110 or a different substrate carrier 110 may be used. For example, in one embodiment a closest empty substrate carrier 110 that is positioned over the first planar motor 310 may be used. The substrate carrier 110 and the substrate 50 on the substrate carrier 110 are removed from the destination process chamber by adjusting magnetic fields generated by coils in the first planar motor 310 to levitate and move the substrate carrier 110.

At decision operation 414, the controller 75 determines whether additional processing of the substrate 50 will be done in one of the process chambers 303. If additional processing is to be done on the substrate 50 in one of the process chambers 303, then the blocks described above are repeated starting with block 404 to allow the substrate 50 to be processed in a next destination process chamber. Blocks 404-414 can be repeated as many times as necessary. If no additional processing is to be done in one of the process chambers 303, then the process sequence 400 proceeds to block 416.

At block 416, the substrate carrier 110 and the substrate 50 on the substrate supporting surface 112 of the substrate carrier 110 are levitated and moved from a position above the top surface 314 of the first planar motor 310 to a position above the top surface 324 of the second planar motor 321 by adjusting magnetic fields generated by coils in the first planar motor 310 and the second planar motor 321. The second planar motor 321 is coupled to the first lift 320 and the top surface 324 of the second planar motor 321 is at the first vertical location 351 during block 416.

At block 418, the top surface 324 of the second planar motor 321 is moved from the first vertical location 351 to the second vertical location 352 by using the first lift 320.

At block 420, the substrate carrier 110 and the substrate 50 on the substrate supporting surface 112 of the substrate carrier 110 are levitated and moved from a position above the top surface 324 of the second planar motor 321 to a position above the top surface 334 of the third planar motor 330 by adjusting magnetic fields generated by coils in the second planar motor 321 and the third planar motor 330. The top surface 334 of the third planar motor 330 is disposed at the second vertical location 352 during block 420.

At block 422, the substrate carrier 110 and the substrate 50 on the substrate supporting surface 112 of the substrate carrier 110 are levitated and moved from a position above the top surface 334 of the third planar motor 330 to a position above the top surface 344 of the fourth planar motor 341 by adjusting magnetic fields generated by coils in the third planar motor 330 and the fourth planar motor 341. The fourth planar motor 341 is coupled to the second lift 340 and the top surface 344 of the fourth planar motor 341 is at the second vertical location 352 during block 422.

At block 424, optionally, the top surface 344 of the fourth planar motor 341 is moved from the second vertical location 352 to the first vertical location 351 by using the second lift 340.

At block 426, the substrate 50 is transferred from the substrate supporting surface 112 of the substrate carrier 110 to one of the load lock chambers 307. In one embodiment, a robot (not shown) in one of the load lock chambers 307 transfers the substrate 50 from the substrate supporting surface 112 of the substrate carrier 110 to one of the load lock chambers 307.

The substrate transfer system 300 and the process sequence 400 allow a substrate 50 to be efficiently processed while minimizing particle generation. Using the two planar motors 310 and 330 at different vertical locations along with the two vertical lifts 320 and 340 allows the substrate carriers 110 to travel in one direction, which minimizes any potential interference between substrate carriers 110 that would move in opposite directions, which will increase throughput and transfer efficiency. Furthermore, the substrate carriers 110 in the substrate transfer system 300 can move a substrate 50 directly from a transfer from one of the load lock chambers 307 to inside one of the process chambers 303 without contacting any surface within the substrate transfer system 300 which minimizes particle generation and improves product quality and device yield. The lack of additional equipment besides the first planar motor 310 and the substrate carrier 110 to move a substrate 50 into one of the process chambers 303 also enables the footprint of the substrate transfer system to be reduced, which allows for more substrates to be processed within a given area increasing efficiency.

Although the substrate transfer system 300 and the process sequence 400 are described as moving substrates 50 through the substrate transfer system using multiple planar motors and lifts, other embodiments may include less planar motors, such as only one planar motor, and less lifts, such as no lifts. In such embodiments, the substrate carriers 110 can transport the substrates 50 in a first direction from the load lock chamber to one of the process chambers before processing and then transport the substrates 50 in the reverse direction back towards the load lock chamber after processing. An embodiment including only one planar motor allows the footprint of the substrate transfer system to be reduced even further relative to the substrate transfer system 300 described above.

Furthermore, although the substrate transfer system 300 and other substrate transfers systems discussed herein are described as using planar motors, such as the first planar motor 310, using a plurality of coils to create magnetic fields to move the substrate carriers 110 through the respective substrate transfer system, other designs are possible. For example in some embodiments, a substrate carrier similar to the substrate carrier 110 can be magnetically coupled to a movable object located in an environment external to the process environment of the substrate transfer system (e.g., a vacuum environment in which the substrate carrier is located). The transfer system and external environment may be separated from each other by a non-magnetic material containing wall that is used to physically separate these two regions. In one embodiment, a magnetic cart can be placed in a track in the external environment and a conveyor may be used to move the magnetic cart. Magnetic fields generated by coils (e.g., coils 120) in the magnetic cart can interact with a complementary arrangement of magnets disposed in the substrate carrier to control the position of the substrate carrier within the substrate transfer system. In one embodiment, a substrate carrier may be placed on a corresponding track, so that movement of the substrate carrier can be aligned by the track, for example in two dimensions, and motion of the magnetic cart can cause movement of the substrate carrier in a third dimension (e.g., from a load lock chamber to a process chamber). Although contact between the substrate carrier and the track for the substrate carrier may result in increased particle generation relative to substrate transfer systems using planar motors, the capital costs of such a substrate transfer system is likely significantly less than a substrate transfer system using planar motors. Furthermore, a substrate transfer system using a substrate carrier magnetically coupled to an external movable object, such as the magnetic cart described above, will cause significantly less particle generation than substrate transfer systems using conventional transfer equipment (e.g., conveyors) located in the environment of the substrate carriers.

Exemplary Substrate Transfer System Using Process Stations

Figure 5A:
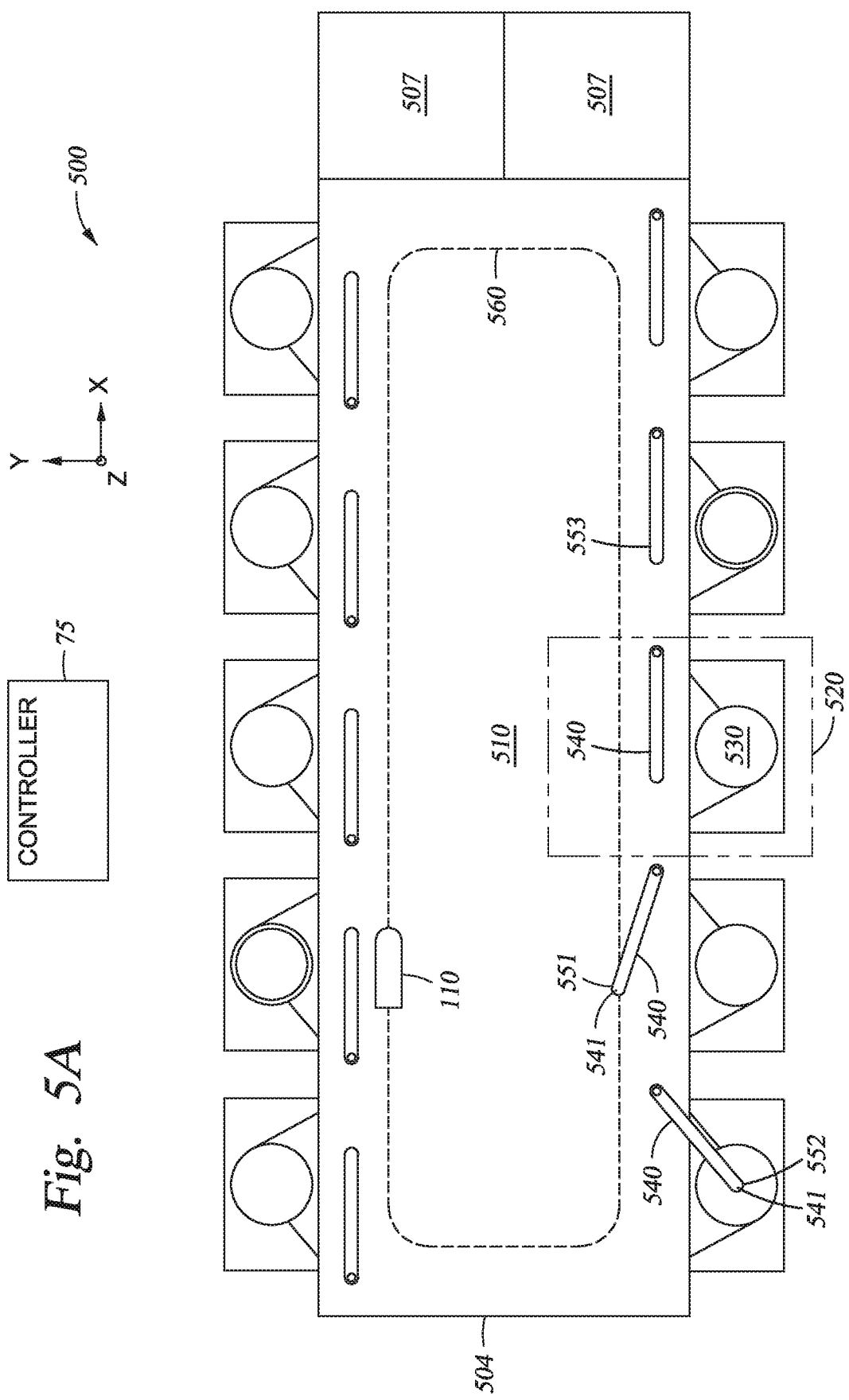
FIG. 5A is a top view of a substrate transfer system, according to one embodiment.

FIG. 5A is a top view of a substrate transfer system 500, according to one embodiment. FIG. 5B is a partial sectional side view of the substrate transfer system 500, according to the embodiment of FIG. 5A. Referring to FIGS. 5A and 5B, the substrate transfer system 500 includes a housing 504 to contain a vacuum in the interior of the substrate transfer system 500. The substrate transfer system 500 further includes a first planar motor 510 having a first arrangement of coils 512 disposed along a first horizontal direction 505. A top surface 514 of the first planar motor 510 is parallel to the first horizontal direction 505. Although the system 500 is described using only the first planar motor 510, in some embodiments more than one planar motor may be used. The substrate transfer system 500 further includes the controller 75 described above.

The substrate transfer system 500 further includes a plurality of substrate carriers, which can all be the substrate carrier 110 described above. Each substrate carrier 110 is configured to support a substrate 50. The substrate supporting surface 112 of the substrate carriers 110 is parallel to the X-Y plane. The coils in the first arrangement of coils 512 can be energized by the controller 75 to generate a magnetic field to levitate the substrate carriers 110 above the top surface 514. The substrate carriers 110 are disposed over the top surface 514 when the substrate carriers 110 are magnetically levitated. The plurality of magnets 114 disposed in each of the substrate carriers 110 are positioned in a complementary arrangement to the first arrangement of coils 512.

The substrate transfer system 500 further includes a plurality of process stations 520 disposed around the first planar motor 510. A dashed line in FIG. 5A indicates the location of one process station 520 within the substrate transfer system 500. Each process station 520 includes a process chamber 530 and a transfer support 540. Each process chamber 530 can include an opening 509 (see FIG. 5B) that is configured to receive a substrate 50 disposed on the transfer support 540. The opening 509 is covered by a door 508 during processing. The transfer support 540 includes a portion 541 configured to move a substrate 50 between a first transfer position 551 outside the process chamber 530 and a second transfer position 552 inside the process chamber 530. The first transfer position 551 is generally positioned so that the transfer support 540 can either pick-up a substrate 50 from or drop-off a substrate to a substrate carrier 110 that is positioned outside the process station 520. The second transfer position 552 is generally positioned so that the transfer support 540 can either pick-up a substrate 50 from or drop-off a substrate to a substrate support element within the process chamber 530. The transfer support 540 can also move to an inactive position 553 when not transferring a substrate 50. In one embodiment, each transfer support 540 is an arm rotatable between the first transfer position 551 and the second transfer position 552. In addition to rotational movement, the transfer support 540 may also move in a vertical direction (z direction) to aid in transfer of the substrate 50 to and from the substrate carrier 110 and to and from the process chamber 530. In one embodiment, the portion 541 includes an end effector (not illustrated) to lift the substrate 50 away from the substrate carrier 110. For example, the portion 541 including the end effector may rotate towards the substrate supporting surface 112 of the substrate carrier 110 and then the vertical position of the portion 541 including the end effector may be raised to lift the substrate 50 around the edges of the substrate 50 removing the substrate 50 from the substrate carrier 110. Then the transfer support 540 can be rotated to place the substrate 50 into the process chamber 530 of that process station 520. Lift pins (not shown) in the process chamber 530 may be raised to remove the substrate 50 from the transfer support 540. Alternatively, the transfer support 540 may be lowered to place the substrate 50 onto a support within the process chamber 530.

The controller 75 can be configured to move the plurality of substrate carriers 110 above the top surface 514 of the first planar motor 510 by adjusting magnetic fields generated by coils in the first arrangement 512. The controller 75 can further be configured to stop the plurality of substrate carriers 110 at the plurality of process stations 520 by holding the magnetic fields generated by each of the coils in the first arrangement 512 substantially constant, and each substrate carrier 110 can be stopped at a different process station 520. The controller 75 can further be configured to move each substrate carrier 110 in a loop 560 above the top surface 514 of the first planar motor 510, where the loop 560 passes through the first transfer position 551 of each process station 520. The loop 560 can also pass through transfer locations that of other chambers, such as load lock chambers 507. Used herein, a loop refers to a path that encloses a central area, where the path may or may not include curved portions and/or straight portions. For example, the loop can take a common shape, such as an oval shape or a rectangular shape, or the loop can take an irregular shape.

Referring to FIGS. 5A, 5B, and 6A-6C, process sequences 600, 620, and 640 are described for moving substrates 50 through the substrate transfer system 500. Process sequence 600 provides details for moving the substrate carriers 110 above the first planar motor 510, for example around the loop 560 described above. Process sequence 620 provides details for transferring a substrate 50 from a substrate carrier 110 to a process chamber 530. Process sequence 640 provides details for transferring a substrate 50 from a process chamber 530 to a substrate carrier 110. Although the process sequences 600, 620, 640 are described in conjunction with reference to the systems of FIGS. 5A and 5B, persons skilled in the art would understand that any substrate transfer system configured to perform the method steps, in any order, is within the scope of the embodiments disclosed herein. Each of the process sequences 600, 620, 640 can be executed by the controller 75, which can control equipment, such as the power supplied to the coils in the first planar motor 510, the transfer supports 540, doors 508 on the process chambers 530, etc.

At block 602, the controller 75 checks for an all clear condition. The all clear condition may include statuses, such as no faults, all doors 508 (FIG. 5B) to process chambers 530 are closed or other beneficial states of the various components in the substrate transfer system 500. The controller 75 may also check to see if there is a reason to move the substrate carriers 110. For example, if all of the substrate carriers 110 are empty (i.e., not carrying a substrate 50), and there is a substrate carrier 110 at each process station 520, then it would be unnecessary to move the substrate carriers 110.

At block 604, a plurality of substrate carriers 110 are levitated and moved along the loop 560 above the top surface 514 of the first planar motor 510 by adjusting magnetic fields generated by coils in the first planar motor 510. Each substrate carrier 110 may or may not be carrying a substrate 50. For example, one of the substrates 50 may be disposed on a substrate supporting surface 112 of a first substrate carrier 110. In some embodiments, the substrate carriers 110 may be moved simultaneously in a coordinated manner, where all of the substrate carriers 110 can begin moving at the same time and arrive at the next transfer location (e.g., process station 520) at the same time. Such coordination can extend to the opening and closing of the doors 508 of the process chambers 530, and the transfer of substrates 50 into and out of the process chambers 530. Despite the option of coordinated movement among the substrate carriers 110, independent movement of the substrate carriers 110 may also be used. For example, if a fault is detected with a particular substrate carrier 110, it may be beneficial to levitate and move the faulty substrate carrier 110 from the loop 560 to one of the load lock chambers 507 and independently supply another substrate carrier 110 to fill the empty transfer location on the loop 560. As another example, it may be beneficial to slightly stagger the movement of the different substrate carriers 110 to reduce a surge in current that may occur from the simultaneous energizing of different coils to create the movement of the substrate carriers 110.

At block 606, the plurality of substrate carriers 110 are each stopped in a levitated position at a transfer locations 551 outside a process station 520 on the loop 560 for a delay period by holding the magnetic fields generated by each of the coils in the first planar motor 510 substantially constant. Each transfer location is configured for transferring a substrate 50 from a substrate carrier 110 to a chamber (e.g., a process chamber 530 or a load lock chamber 507). Each substrate carrier 110 is stopped at a different transfer location 551. At least two of the transfer locations are positioned at process stations 520. For example, a first substrate carrier 110 can be stopped at a first process station 520. In some embodiments, all of the transfer locations on the loop 560 are positioned at process stations 520. In other embodiments, at least some of the transfer locations on the loop 560 include other locations, such as locations for transferring a substrate 50 to or from a load lock chamber 507. In some embodiments, there may be a substrate carrier 110, stopped at every transfer location. For example, in one embodiment, if there are 12 transfer locations, then there may be 12 substrate carriers with one substrate carrier stopped at each transfer location. In other embodiments, there may be more or less transfer locations as well as more or less substrate carriers 110.

At block 608, the controller waits for the delay period started in block 606 to expire. The delay period allows time for the process sequences 620 and 640 to be executed at each of the process stations 520 allowing substrates 50 to be transferred between the substrate carriers 110 and the process chambers 530 of the different process stations. Upon expiration of the delay period, the process sequence 600 is repeated starting from block 602 when the controller waits for the all clear condition described above. The all clear condition can be used to ensure that the process sequences 620 and 640, which may have recently been started have finished.

Figure 6A:
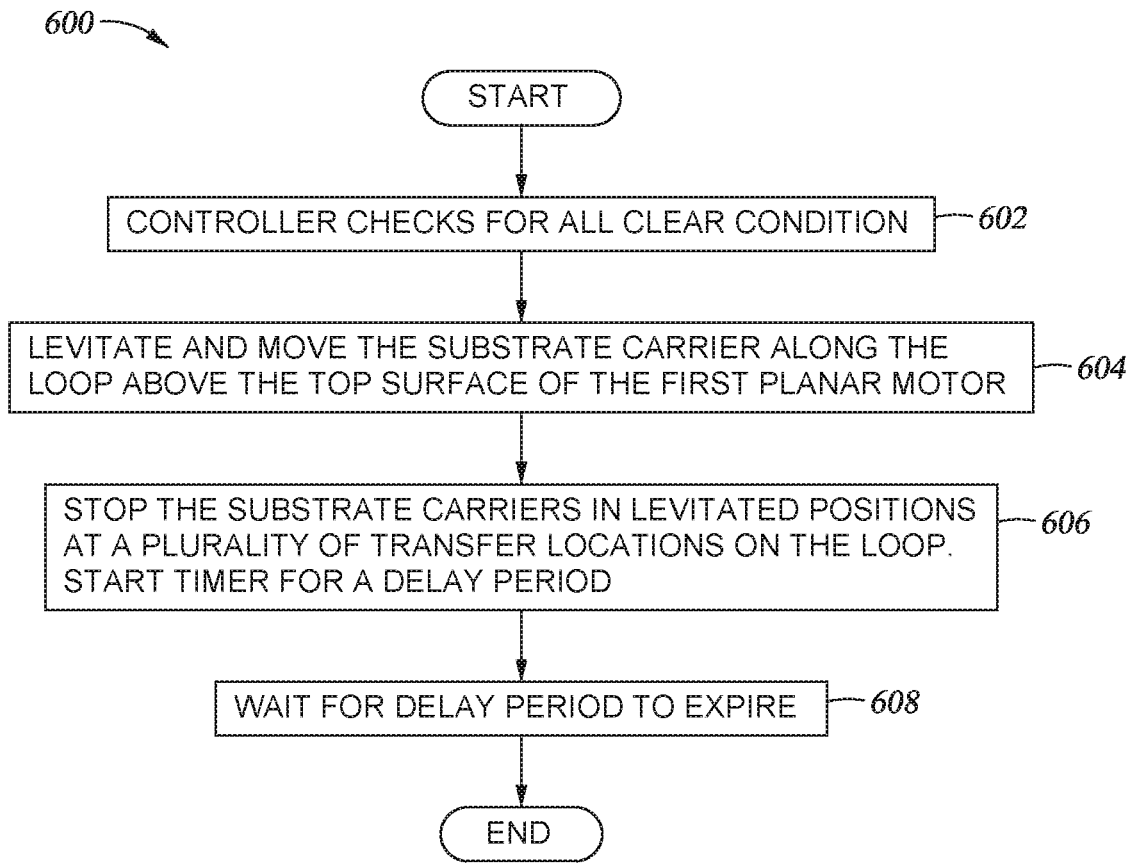
FIG. 6A is a process flow diagram for moving a substrate through the substrate transfer system illustrated in FIGS. 5A to 5B.
Figure 6B:
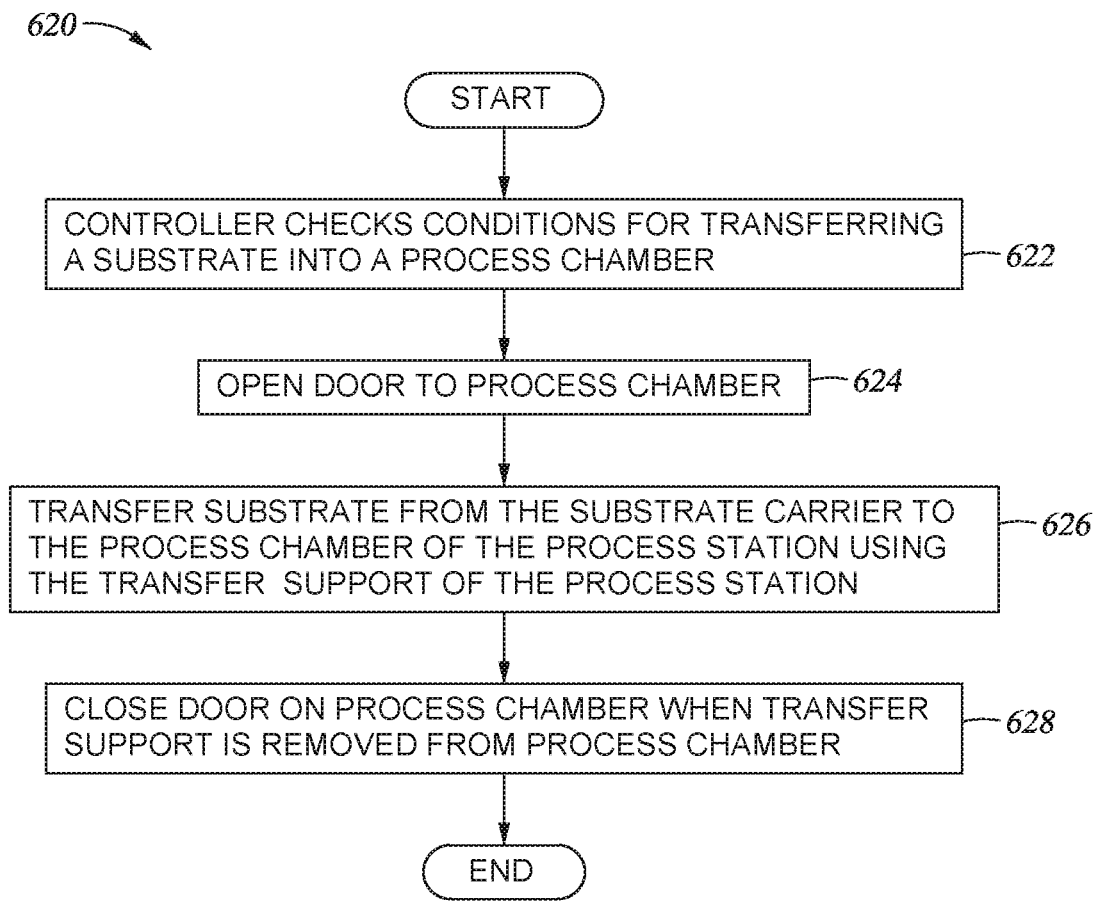
FIG. 6B is a process flow diagram for supplying a substrate to a process chamber in the substrate transfer system illustrated in FIGS. 5A to 5B.

Referring to FIG. 6B, the process sequence 620 is described for transferring a substrate 50 from a substrate carrier 110 to a process chamber 530. While process sequence 600 is executed at the system level (i.e., one method for the substrate transfer system 500), process sequence 620 is executed at the process station level (i.e., a separate method for each process station 520).

At block 622, the controller 75 checks conditions to determine whether to transfer a substrate 50 into the process chamber 530 of a given process station 520. First, the controller 75 checks to ensure the substrate carrier 110 at the process station 520 is in a stopped position. The controller 75 can check a stopped position of the substrate carrier 110 by receiving data from sensors within the substrate transfer system 500 or from the status of the process sequence 600 activating block 606 that stops the substrate carriers at the process stations 520. Second, the controller 75 also checks whether the substrate carrier 110 at the process station 520 is full (i.e., carrying a substrate). Third, the controller 75 also checks whether the destination of the substrate carrier 110 is the process chamber 530 of the current process station 520 at which the substrate carrier 110 is located. Fourth, the controller checks to ensure the process chamber 530 of the process station 520 is ready to accept a substrate 50. If all four of these conditions are true, then the process sequence 620 proceeds to block 624. If any of these four conditions is not true or a relevant fault is active, then process sequence 620 remains at block 622. The order in which the controller 75 checks these four conditions is not important.

At block 624, the door 508 of the process chamber 530 is opened. The door 508 of the process chamber 530 is configured to allow the transfer of a substrate 50 when opened.

At block 626, the substrate 50 is transferred from the substrate carrier 110 to the process chamber 530 of the process station 520 using the transfer support 540 of the process station 520. As described above, the transfer support 540 can be a rotatable arm that can remove the substrate 50 from the substrate carrier 110 and place the substrate 50 into the process chamber 530.

At block 628, the door 508 of the process chamber 530 is closed when the transfer support 540 is removed from the process chamber 530. After block 628, the process sequence 620 returns to block 622 to determine when to perform another transfer of a substrate 50 into the process chamber 530.

Figure 6C:
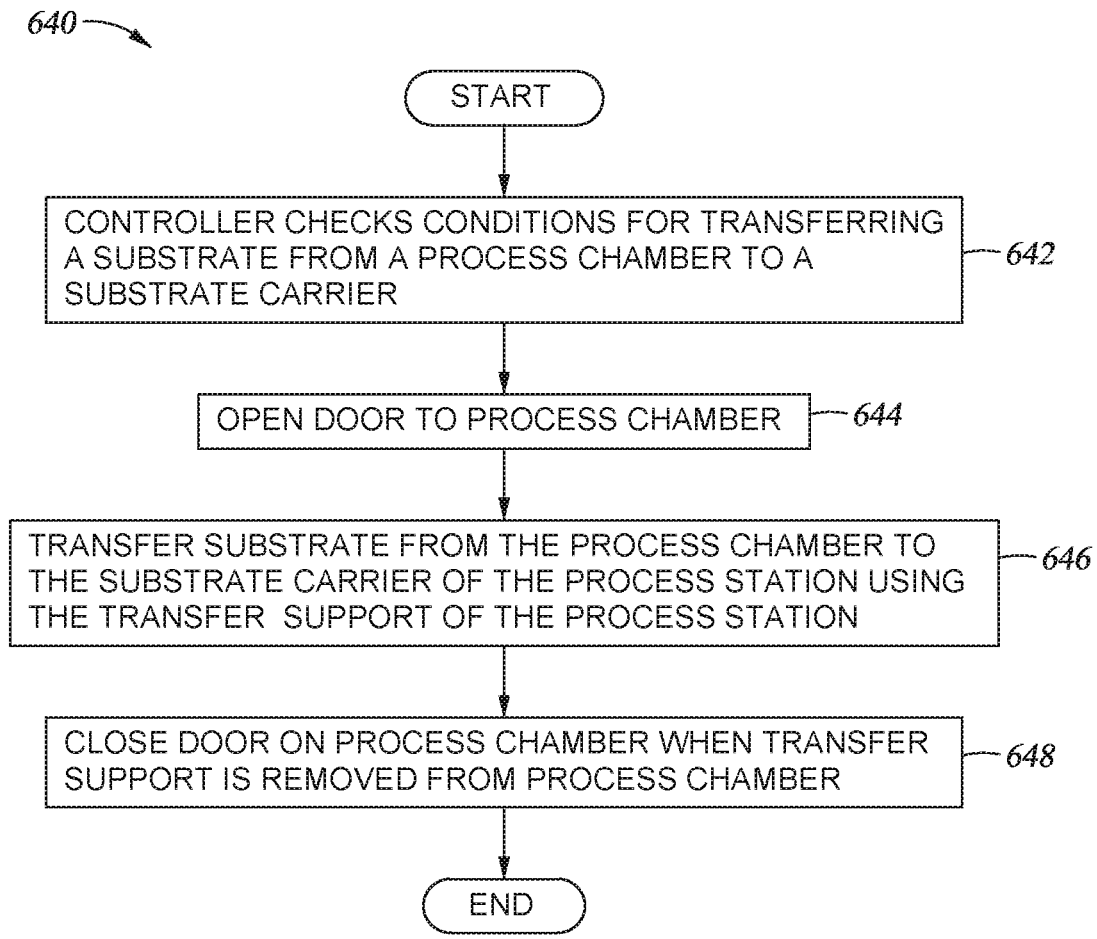
FIG. 6C is a process flow diagram for removing a substrate from a process chamber in the substrate transfer system illustrated in FIGS. 5A to 5B.

Referring to FIG. 6C, the process sequence 640 is described for transferring a substrate 50 from a process chamber 530 to a substrate carrier 110. While process sequence 600 is executed at the system level (i.e., one method for the substrate transfer system 500), process sequence 640 is executed at the process station level (i.e., a separate method for each process station 520).

At block 642, the controller 75 checks conditions to determine whether to transfer a substrate 50 from the process chamber 530 of a given process station 520 to a substrate carrier 110 located at the process station 520. First, the controller 75 checks to ensure the substrate carrier 110 at the process station 520 is in a stopped position. The controller 75 can check a stopped position of the substrate carrier 110 by receiving data from sensors within the substrate transfer system 500 or from the status of the process sequence 600 activating block 606 that stops the substrate carriers 110 at the process stations 520. Second, the controller 75 also checks whether the substrate carrier 110 at the process station 520 is empty (i.e., not carrying a substrate). Third, the controller checks to ensure the process chamber 530 of the process station 520 is ready to remove a substrate 50 (e.g., the process performed on the substrate 50 in the process chamber 530 is complete). If all three of these conditions are true, then the process sequence 640 proceeds to block 644. If any of these three conditions is not true or a relevant fault is active, then process sequence 640 remains at block 642. The order in which the controller 75 checks these four conditions is not important.

At block 644, the door 508 of the process chamber 530 is opened. The door of the process chamber 530 is configured to allow transfer of a substrate 50 when opened.

At block 646, the substrate 50 is transferred from the process chamber 530 of the process station 520 to the substrate carrier 110 using the transfer support 540 of the process station 520. As described above, the transfer support 540 can be a rotatable arm that can remove the substrate 50 from the process chamber 530 and place the substrate 50 onto the substrate carrier 110.

At block 648, the door 508 of the process chamber 530 is closed when the transfer support 540 is removed from the process chamber 530. After block 648, the process sequence 640 returns to block 642 to determine when to perform another transfer of a substrate 50 from the process chamber 530 to a substrate carrier 110.

The substrate transfer system 500 and the process sequences 600, 620, and 640 allow a substrate 50 to be efficiently processed. By placing substrate carriers at numerous or all of the transfer locations in the loop 560, the substrates 50 can efficiently be moved through the substrate transfer system 500 as each substrate carrier moves to the next transfer location after the delay period described above. Furthermore, when a substrate is finished being processed, it is often unnecessary for a specific substrate carrier 110 to be sent to the process station 520, where the finished substrate 50 is waiting because there is likely already an empty substrate carrier 110 in the loop 560 on its way. In many instances, there will already be an empty substrate carrier 110 waiting at the process station 520 as a substrate 50 finishes processing. For example, at various points in time there may be no substrates 50 waiting to be added to a process chamber 530. At these points in time each substrate carrier 110 is empty, and an empty substrate carrier can be placed at each transfer location. If there is at least one substrate 50 on a substrate carrier 110, then the substrate carriers 110 can move to the next transfer location after the delay period (see blocks 606-608 of process sequence 600) discussed above. This delay period can be adjusted to reduce the amount of time that any one substrate 50 remains in a process chamber 530 after processing in that chamber 530 finishes.

Using the transfer supports 540 also enables the footprint of the substrate transfer system 500 to be reduced because it is unnecessary to rotate the substrate carriers 110 into the process chambers 530. Also using the first planar motor 510 instead of a conveyor system allows particle generation to be reduced.

Exemplary Substrate Transfer System for Vertically Arranged Process Chambers

Figure 7B:
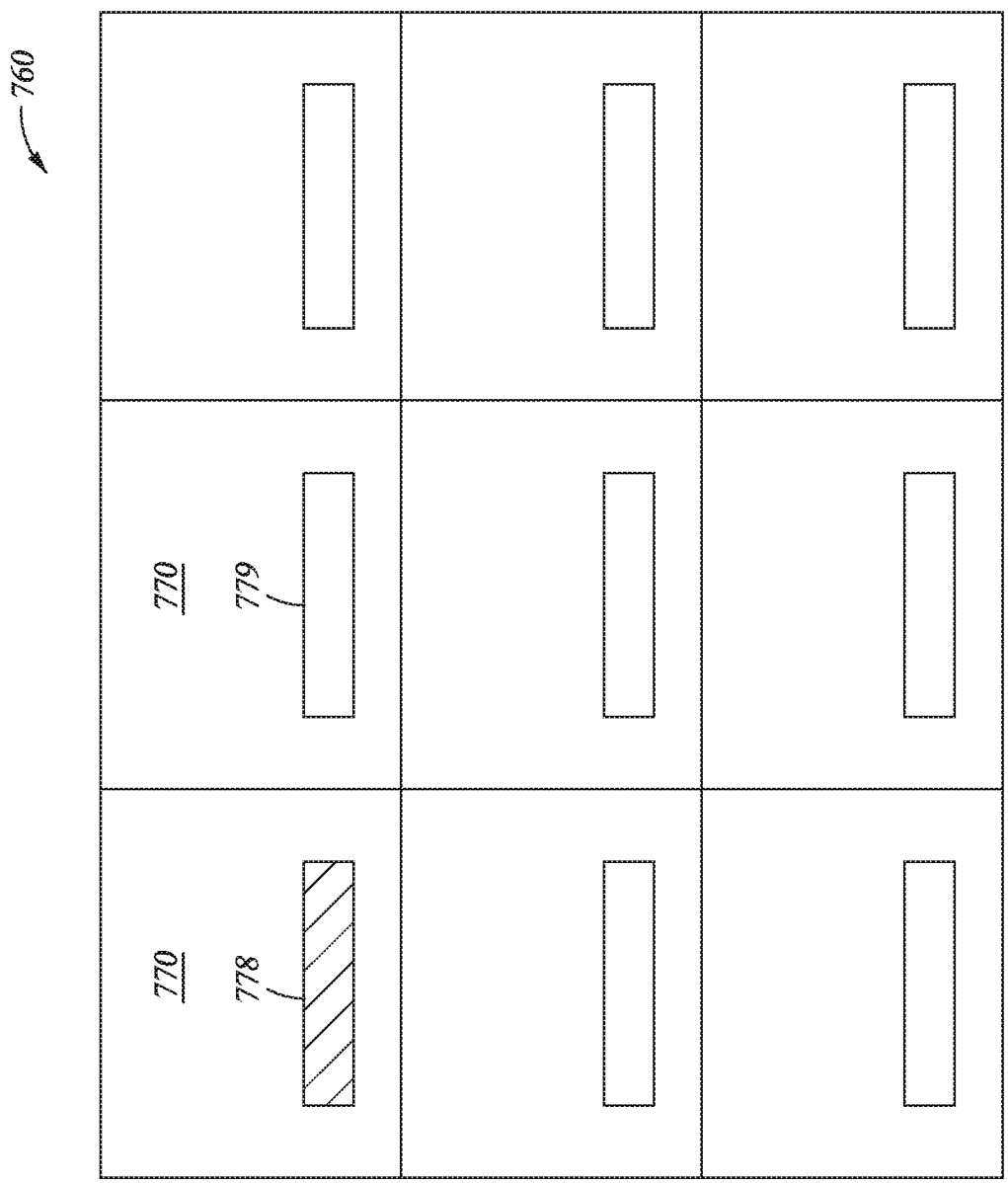
FIG. 7B is a side view of a substrate transfer system, according to the embodiment of FIG. 7A.

FIG. 7A is a side view of a substrate transfer system 700, according to one embodiment. FIG. 7B is a side view of a processing rack 760 used in the substrate transfer system 700. Referring to FIGS. 7A and 7B, the substrate transfer system 700 includes a first planar motor 710 having a first arrangement of coils 712 disposed across a first plane. The first plane can be substantially horizontal, and is illustrated as the X-Y plane in FIG. 7A. The first planar motor 710 includes a first surface 714, a first end 715, and an opposing second end 716. The first surface 714 is parallel to the X-Y plane. The substrate transfer system 700 also includes the controller 75 described above.

The substrate transfer system 700 further includes a second planar motor 720 having a second arrangement of coils 722 disposed across a second plane. The second plane can be the Y-Z plane as shown in FIG. 7A. The second planar motor 720 includes a second surface 724, a first end 725, and an opposing second end 726. The first plane can be substantially perpendicular to the second plane. The second end 726 of the second planar 720 motor faces the first surface 714 of the first planar motor 710. A gap between the second end 726 of the second planar motor 720 and the first surface 714 of the first planar motor 710 is between 0.2 mm and 2 mm.

The substrate transfer system 700 further includes the processing rack 760 including a plurality of process chambers 770 disposed across a third plane that is substantially perpendicular to the first plane. The third plane can be substantially vertical. The processing rack 760 generally contains one or more groups of vertically stacked processing chambers 770 that are adapted to perform processes (e.g., deposition, etching, and thermal processing) on the substrates 50. Each of the process chambers 770 includes an opening 779 that allows a substrate 50 to be transferred into and out of the process chamber 770 when a door 778 on the process chamber 770 is opened. Although only processing rack 760 is shown, in some embodiments two or more processing racks may be included in the substrate transfer system 700. In these embodiments, one or more of the additional processing racks may be disposed such that the openings 779 in the additional processing racks are parallel to a third plane, such as the X-Z plane, of the processing rack 760.

The substrate transfer system 700 further includes an actuator 730 coupled to the second planar motor 720. The actuator 730 is operable to change a distance between the second surface 724 of the second planar motor 720 and the plurality of process chambers 770. The substrate transfer system 700 further includes a housing (not shown) to contain a vacuum in the interior of the substrate transfer system 200.

Figure 7C:
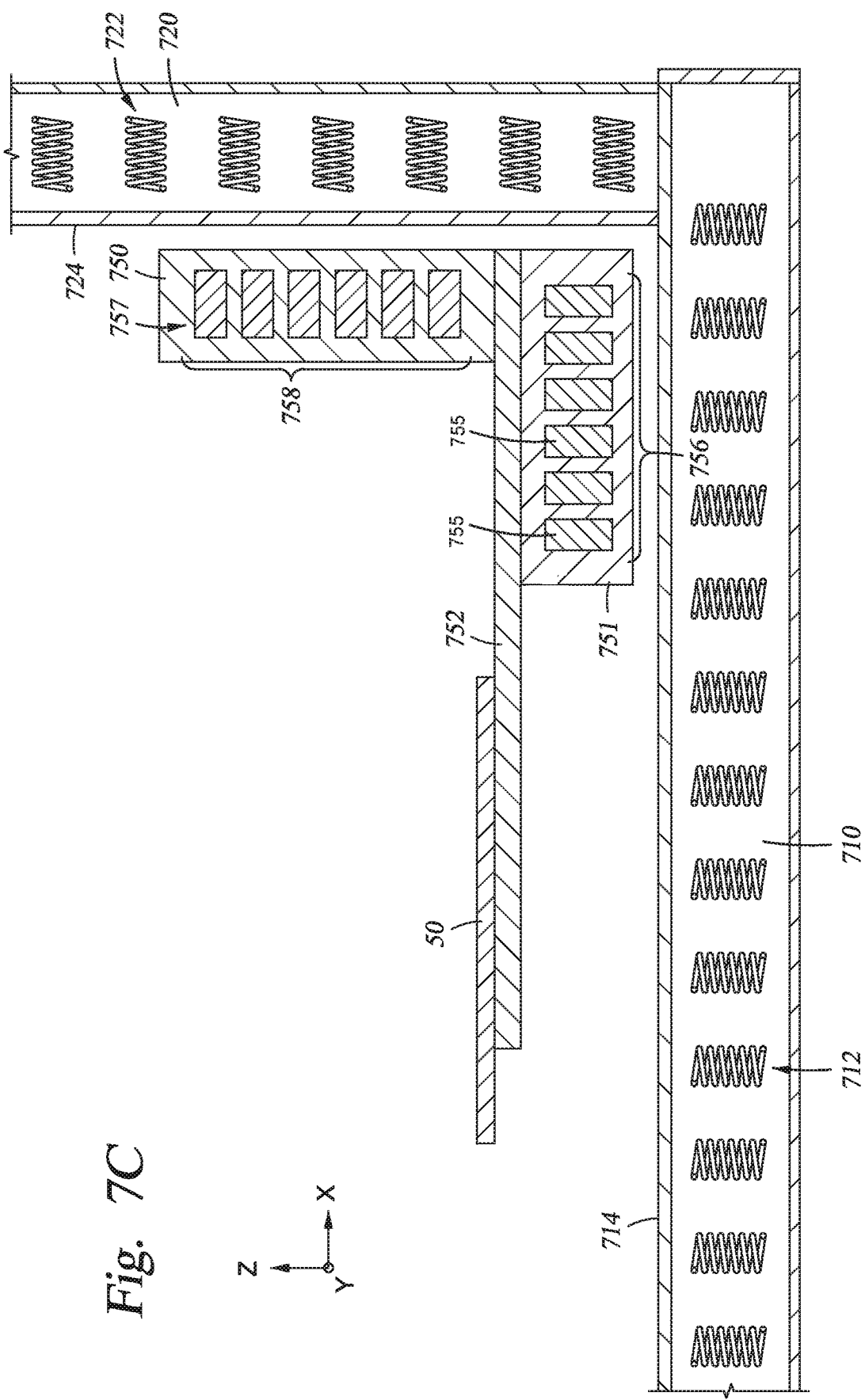
FIG. 7C is a side sectional view of a substrate carrier to be used with the substrate transfer system of FIGS. 7A and 7B.
Figure 8:
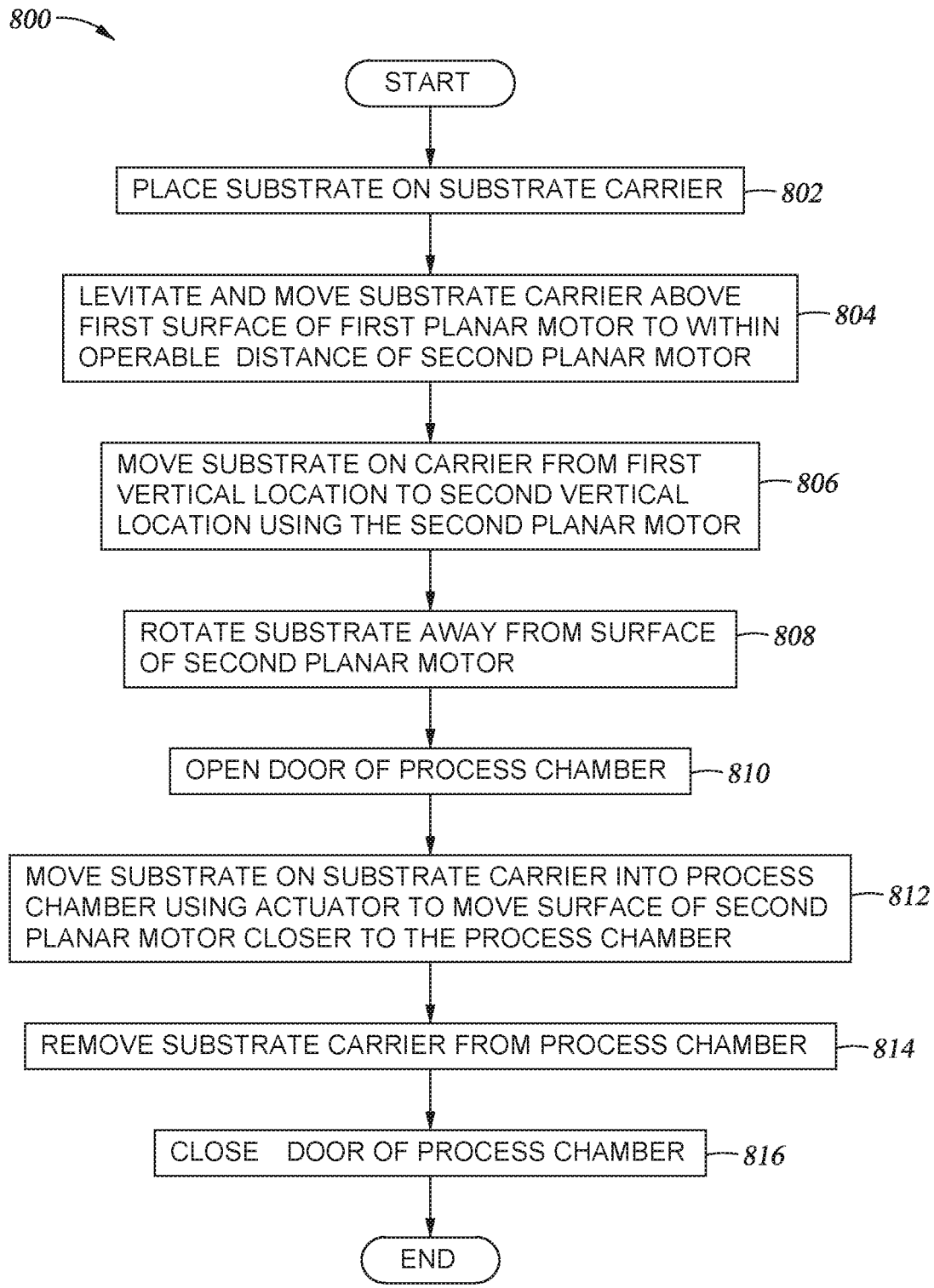
FIG. 8 is a process flow diagram for transferring a substrate into a process chamber in the substrate transfer system illustrated in FIGS. 7A to 7C.

FIG. 7C is a sectional side view of a substrate carrier 750. The substrate transfer system 700 includes the substrate carrier 750 including a base 751 and a substrate supporting surface 752 to carry a substrate 50. The base 751 includes a first plurality of magnets 755 disposed in a first magnet arrangement 756. The first magnet arrangement 756 is aligned substantially parallel to the substrate supporting surface 752. The base 751 further includes a second plurality of magnets 757 disposed in a second magnet arrangement 758. The second magnet arrangement 758 is aligned substantially perpendicular to the first magnet arrangement 756. The second magnet arrangement 758 may also be arranged in a non-planar arrangement relative to the X-Z and Y-Z planes. In one example, the second magnet arrangement 758 may be substantially formed in a U-shape which allows the substrate carrier 750 to be rotated about the Z-axis and thus within the X-Y plane. In some configurations, the plurality of magnets 755 and 757 may be arranged such that they form a Halbach array or other similar configuration.

Referring to FIGS. 7A to 7C and FIG. 8, a method 800 is described for transferring a substrate 50 from a substrate carrier 750 to a process chamber 770. Although the method 800 is described in conjunction with reference to the systems of FIGS. 7A to 7C, persons skilled in the art would understand that any substrate transfer system configured to perform the method steps, in any order, is within the scope of the embodiments disclosed. The method 800 can be executed by the controller 75, which can control equipment, such as the power supplied to the coils in the planar motors 710, 720 the actuator 730, doors 778 on the process chambers 770 or other devices within the substrate transfer system 700.

At block 802, the substrate 50 is placed on the substrate supporting surface 752 of a substrate carrier 750. The substrate carrier 750 may be in a levitated position when the substrate 50 is placed on the substrate carrier 750. In one example, a robot in a load lock chamber (not shown) can be used to place the substrate 50 on the substrate carrier 750. In some cases, the substrate carrier 750 picks-up a substrate from another supporting chamber (not shown), such as a load lock.

At block 804, the substrate carrier 750 is levitated and moved above the first surface 714 of the first planar motor 710. The first planar motor 710 includes the first arrangement of coils 712 disposed across the X-Y plane described above. The substrate carrier 750 is levitated and moved by adjusting magnetic fields generated by coils in the first planar motor 710. During block 804, the substrate carrier 750 is moved to be within an operable distance from the second planar motor 720, meaning that the second planar motor 720 can move the substrate carrier 750 in a controlled manner when the substrate carrier 750 is within the operable distance.

At block 806, the substrate 50 on the substrate supporting surface 752 of the substrate carrier 750 is moved from a first vertical location to a second vertical location by adjusting magnetic fields generated by coils in the second planar motor 720. The second planar motor includes the second surface 724 facing the substrate carrier 750. The second planar motor 720 has the second arrangement of coils 722 disposed across a vertical plane as described above. The substrate carrier 750 moves from the first vertical location to the second vertical location along a path displaced from the second surface 724.

At block 808, optionally, the substrate 50 on the substrate supporting surface 752 of the substrate carrier 750 is rotated away from the second surface 724. This rotation is used if the end of the substrate carrier 750 supporting the substrate 50 is not facing the process chambers 770. This rotation can be useful if there are other substrate carriers 750 between the second surface 724 of the second planar motor 720 and the process chambers 770, so that the substrate carriers 750 not transferring a substrate 50 do not collide with the process chambers 770 during block 812 described below when the second planar motor 720 is moved. Otherwise, the rotation may be omitted, such as when there is only one substrate carrier 750 between the second surface 724 of the second planar motor 720 and the process chambers 770.

At block 810, the door 778 of the process chamber 770 is opened. The door 778 of the process chamber 770 is configured to allow transfer of a substrate 50 when opened.

At block 812, the substrate 50 on the substrate supporting surface 752 of the substrate carrier 750 is moved into the designated process chamber 770 by using an actuator 730 to move the second surface 724 of the second planar motor 720 closer to the first process chamber 770. The magnetic fields from the coils in the second planar motor 720 retain and push the substrate carrier 750 towards the process chamber 770. The substrate 50 can be removed from the substrate carrier 750 by using lift pins within the chamber, for example.

At block 814, the substrate carrier 750 is moved away from the process chamber 770 using the actuator 730 to move the second surface 724 of the second planar motor 720 away from the first process chamber 770. The magnetic fields from the coils in the second planar motor 720 pull the substrate carrier 750 away from the process chamber 770.

At block 816, the door 778 to the process chamber 770 can be closed enabling processing of the substrate 50 in the process chamber 770.

Using a processing rack 760 with one or more groups of vertically arranged process chambers 770 allows for a high number of process chambers 770 to be placed in a small area. By transferring the substrates 50 to the process chambers 770 using the first and/or second planar motors 710, 720 to levitate the substrate carrier 750, contact between the substrate carrier 750 and other components in the substrate transfer system 700 is minimized reducing particle generation. Overall, the substrate transfer system 700 provides an efficient system with low footprint and reduced particle generation.

While the foregoing is directed to embodiments of the present disclosure, other and further embodiments of the disclosure may be devised without departing from the basic scope thereof, and the scope thereof is determined by the claims that follow.

The invention claimed is:

1. A system for processing substrates, comprising:
a first planar motor comprising a first arrangement of coils disposed along a first horizontal direction, and a top surface that is parallel to the first horizontal direction;
a plurality of substrate carriers that each have a substrate supporting surface that is parallel to the first horizontal direction, wherein each substrate carrier is configured to support a substrate and each substrate carrier is configured to be disposed over the top surface;
a plurality of process stations disposed around the first planar motor, each process station comprising:
a process chamber; and
a transfer support including a portion configured to move a substrate between a first transfer position outside the process chamber and a second transfer position inside the process chamber; and
a controller configured to levitate and move each substrate carrier in a loop above the top surface of the first planar motor, wherein the loop passes through the first transfer position of each process station and the loop is at least substantially closed, and wherein the controller is configured to levitate and move a first substrate carrier of the plurality of substrate carriers from the loop at the first transfer position of each process station on the loop independent from movement of the other substrate carriers of the plurality of substrate carriers on the loop.

2. The system of claim 1, wherein each substrate carrier comprises a base and a supporting surface connected to the base, wherein the base includes a plurality of magnets.

3. The system of claim 1, wherein each transfer support is an arm rotatable between the first transfer position and the second transfer position.

4. The system of claim 1, wherein the controller is configured to:

move the plurality of substrate carriers above the top surface of the first planar motor by adjusting magnetic fields generated by the coils in the first arrangement; and stop the plurality of substrate carriers at the plurality of process stations by holding the magnetic fields generated by each of the coils in the first arrangement substantially constant, wherein each substrate carrier is stopped at a different process station.

5. The system of claim 1, wherein the loop forms an oval shape.

6. The system of claim 1, wherein the loop forms a rectangular shape.

7. The system of claim 1, wherein the controller is further configured to levitate and move a new substrate carrier to fill the empty first transfer position caused by moving the first substrate carrier from the loop, wherein the movement of the new substrate carrier is independent of the movement of the other substrate carriers of the plurality of substrate carriers on the loop.

8. The system of claim 1, wherein the loop is fully closed.

9. The system of claim 1, wherein
the plurality of substrate carriers comprises at least three substrate carriers, and
the plurality of process stations comprising at least three process stations.

10. A method for moving a substrate in a substrate transfer system, the method executed by a controller and comprising:
(a) levitating and moving a plurality of substrate carriers in a loop above a top surface of one or more planar motors by adjusting magnetic fields generated by coils in the one or more planar motors, wherein the substrate is disposed on a substrate supporting surface of a first substrate carrier of the plurality of substrate carriers;
(b) stopping the plurality of substrate carriers at a plurality of transfer locations on the loop for a delay period by holding the magnetic fields generated by each of the coils in the one or more planar motors substantially constant, each transfer location configured for transferring a substrate from a substrate carrier to a chamber, wherein
each substrate carrier is stopped at a different transfer location, and at least two of the transfer locations are positioned at process stations,
each process station including a process chamber and a transfer support that is configured to move a substrate between a first transfer position outside the process chamber and a second transfer position inside the process chamber,
the loop passes through the first transfer position of each process station, and
the loop is at least substantially closed;
(c) when the first substrate carrier is stopped at a destination process station of the first substrate carrier, transferring the substrate from the first substrate carrier to the process chamber of the destination process station using the transfer support of the destination process station, wherein the controller is configured to levitate and move the first substrate carrier from the loop at each transfer location on the loop independent from movement of the other substrate carriers of the plurality of substrate carriers on the loop; and
(d) repeating (a)-(c).

11. The method of claim 10, further comprising:
when an empty substrate carrier is stopped at a process station having a processed substrate that is ready to be removed from the process chamber of that process station, transferring the processed substrate from process chamber to the empty substrate carrier using the transfer support.

12. The method of claim 11, wherein each transfer support is a rotatable arm.

13. The method of claim 11, wherein at least one of the transfer locations is located at a load lock chamber.

14. The method of claim 13, wherein the loop is oval.

15. The method of claim 13, wherein the loop is rectangular.

16. The method of claim 10, wherein the controller is further configured to levitate and move a new substrate carrier to fill the empty transfer location caused by moving the first substrate carrier from the loop, wherein the movement of the new substrate carrier is independent of the movement of the other substrate carriers of the plurality of substrate carriers on the loop.

17. The method of claim 10, wherein the loop is fully closed.

18. The method of claim 10, wherein
the plurality of substrate carriers comprises at least three substrate carriers, and
the plurality of process stations comprising at least three process stations.

* * * * *